(12) United States Patent
Nakashima et al.

(10) Patent No.: US 8,153,836 B2
(45) Date of Patent: Apr. 10, 2012

(54) SILSESQUIOXANE COMPOUND MIXTURE, HYDROLYZABLE SILANE COMPOUND, MAKING METHODS, RESIST COMPOSITION, PATTERNING PROCESS, AND SUBSTRATE PROCESSING

(75) Inventors: Mutsuo Nakashima, Joetsu (JP); Yoshitaka Hamada, Joetsu (JP); Katsuya Takemura, Joetsu (JP); Kazumi Noda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1168 days.

(21) Appl. No.: 11/860,872

(22) Filed: Sep. 25, 2007

(65) Prior Publication Data

US 2008/0311514 A1    Dec. 18, 2008

(30) Foreign Application Priority Data

Sep. 28, 2006   (JP) ................. 2006-264623

(51) Int. Cl.
C08F 7/21     (2006.01)
C08F 7/08     (2006.01)
G03F 7/075    (2006.01)

(52) U.S. Cl. ........ 556/479; 556/451; 556/460; 556/466; 556/467; 549/214; 430/270.1; 430/905

(58) Field of Classification Search ............... None
See application file for complete search history.

(56) References Cited

U.S. PATENT DOCUMENTS

| | | | |
|---|---|---|---|
| 5,457,249 A | 10/1995 | Toshihiro et al. | |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,294,706 B1 | 9/2001 | Bergstrom et al. | |
| 6,512,020 B1 | 1/2003 | Asakura et al. | |
| 6,623,909 B2 | 9/2003 | Hatakeyama et al. | |
| 2004/0241579 A1* | 12/2004 | Hamada et al. | 430/270.1 |
| 2006/0040206 A1 | 2/2006 | Nakashima et al. | |
| 2006/0105181 A1 | 5/2006 | Lin et al. | |
| 2006/0224009 A1 | 10/2006 | Hamada et al. | |

FOREIGN PATENT DOCUMENTS

| | | |
|---|---|---|
| EP | 1 707 589 A1 * | 10/2006 |
| JP | 5-97719 A | 4/1993 |
| JP | 5-255351 A | 10/1993 |
| JP | 9-95479 A | 4/1997 |
| JP | 9-208554 A | 8/1997 |
| JP | 9-230588 A | 9/1997 |
| JP | 2906999 B2 | 6/1999 |
| JP | 2000-506183 A | 5/2000 |
| JP | 2000-314956 A | 11/2000 |
| JP | 2002-55456 A | 2/2002 |
| JP | 2004-212983 A | 7/2004 |
| JP | 2004-354417 A | 12/2004 |
| JP | 2004-359669 A | 12/2004 |
| JP | 2006-85129 A | 3/2006 |
| JP | 2006-307180 A | 11/2006 |
| WO | 2004-074242 A2 | 9/2004 |
| WO | WO 2005/105802 A1 * | 11/2005 |

OTHER PUBLICATIONS

Japanese Office Action dated Feb. 4, 2009, issued in corresponding Japanese Patent Application No. 2006-264623.
T. Yamashita et al.; "Synthesis of Fluorinated Materials for 193 nm Immersion Lithography and 157 nm Lithography"; Journal of Photopolymer Science and Technology, vol. 18, No. 5, pp. 631-639, 2005.

* cited by examiner

*Primary Examiner* — Sin J. Lee
(74) *Attorney, Agent, or Firm* — Westerman, Hattori, Daniels & Adrian, LLP

(57) ABSTRACT

In a mixture of silsesquioxane compounds comprising silsesquioxane units having a side chain including a direct bond between a silicon atom and a norbornane skeleton and having a degree of condensation of substantially 100%, a dimethylene chain of the norbornane skeleton remote from the silicon bonded side is substituted with at least one substituent group other than hydrogen, and an isomer having a bulkier substituent group on the dimethylene chain at an exo position is present in a higher proportion.

1 Claim, No Drawings

SILSESQUIOXANE COMPOUND MIXTURE, HYDROLYZABLE SILANE COMPOUND, MAKING METHODS, RESIST COMPOSITION, PATTERNING PROCESS, AND SUBSTRATE PROCESSING

CROSS-REFERENCE TO RELATED APPLICATION

This non-provisional application claims priority under 35 U.S.C. §119(a) on Patent Application No. 2006-264623 filed in Japan on Sep. 28, 2006, the entire contents of which are hereby incorporated by reference.

FIELD OF THE INVENTION

The present invention relates to a silsesquioxane compound mixture having a degree of condensation of substantially 100%, which is now of great interest as the functional material, and especially a silsesquioxane compound mixture suitable for use in resist compositions adapted for micropatterning in the fabrication of semiconductor devices or the like, and a hydrolyzable silane compound, and methods for preparing the both. It also relates to a resist composition, and especially a chemically amplified resist composition suited for the photolithography using as a light source high-energy radiation such as deep-UV, KrF excimer laser (248 nm), ArF excimer laser (193 nm), $F_2$ laser (157 nm), electron beam, and x-ray. It further relates to a patterning process and a substrate processing process using the resist composition. Herein, silsesquioxane is often referred to as SSQ.

BACKGROUND ART

In the drive for higher integration and operating speeds in LSI devices, the pattern rule is made drastically finer. Under the miniaturizing trend, the lithography has achieved formation of finer patterns by using a light source with a shorter wavelength and by a choice of a proper resist composition for the shorter wavelength. Predominant among others are positive resist compositions which are used as a single layer. These single layer positive resist compositions are based on resins possessing a structure having resistance to etching with chlorine or fluorine gas plasma and provided with such a resist mechanism that exposed areas become dissolvable. Typically, the resist composition is coated on a patternable substrate and exposed to a pattern of light, after which the exposed areas of the resist coating are dissolved to form a pattern. Then, the patternable substrate can be processed by etching with the remaining resist pattern serving as an etching mask.

In an attempt to achieve a finer feature size, i.e., to reduce the pattern width with the thickness of a resist film kept unchanged, the resist film becomes low in resolution performance. If the resist film is developed with a liquid developer to form a pattern, the so-called "aspect ratio" (depth/width) of the resist pattern becomes too high, resulting in pattern collapse. For this reason, the miniaturization is accompanied by a thickness reduction of the resist film (thinner film). On the other hand, with the progress of the exposure wavelength toward a shorter wavelength, the resin in resist compositions is required to have less light absorption at the exposure wavelength. In response to changes from i-line to KrF and to ArF, the resin has made a transition from novolac resins to poly-hydroxystyrene and to acrylic resins. Actually, the etching rate under the above-indicated etching conditions has been accelerated. This suggests the inevitableness that a patternable substrate is etched through a thinner resist film having weaker etching resistance. It is urgently required to endow the resist film with etching resistance.

Meanwhile, a process known as multilayer resist process was developed in the art for processing a patternable substrate by etching. The process uses a resist film which has weak etching resistance under the etching conditions for the substrate, but is capable of forming a finer pattern, and an intermediate film which has resistance to etching for processing the substrate and can be patterned under the conditions to which the resist film is resistant. Once the resist pattern is transferred to the intermediate film, the substrate is processed by etching through the pattern-transferred intermediate film as an etching mask. A typical process uses a silicon-containing resin as the resist composition and an aromatic resin as the intermediate film. In this process, after a pattern is formed in the silicon-containing resin, oxygen-reactive ion etching is carried out. Then the silicon-containing resin is converted to silicon oxide having high resistance to oxygen plasma etching, and at the same time, the aromatic resin is readily etched away where the etching mask of silicon oxide is absent, whereby the pattern of the silicon-containing resin is transferred to the aromatic resin layer. Unlike the single layer resist film, the aromatic resin need not have light transmittance at all, allowing for use of a wide variety of aromatic resins having high resistance to etching with fluorine or chlorine gas plasma. Using the aromatic resin as the etching mask, the patternable substrate can be etched with fluorine or chlorine gas plasma.

Typical resins used in the bilayer resist process are polysilsesquioxanes (SSQ). In chemically amplified resist compositions of negative type, SSQ having side chains exhibiting solubility in alkaline developer is typically used in combination with crosslinkers and photoacid generators. In chemically amplified resist compositions of positive type, SSQ having acidic side chains protected with acid labile groups is typically used in combination with photoacid generators. In general, the SSQs are prepared through condensation reaction of silane monomers having three silicon-bonded hydrolyzable groups. Since an ordinary synthesis method yields a SSQ product with a noticeable amount of silanol groups left therein, compositions containing the same suffer from a shelf stability problem due to the instability of silanol groups.

Cage silsesquioxanes are typical of silsesquioxanes (SSQ) which are substantially free of silanol groups, that is, have a degree of condensation of substantially 100%. In general, polyhedral oligomeric silsesquioxanes of 6 to 12 monomer units are known and abbreviated as POSS, of which an oligomer of 8 monomer units (referred to as octet) is relatively readily available. Patternable material using POSS compound is described in US Patent Application 2004-0137241 A1 (corresponding to JP-A 2004-212983, simply referred to as Reference 1). A patternable composition is synthesized by starting with a POSS compound having a dimethylsilyloxy group as a spacer substituted on the POSS skeleton, and effecting hydrosilylation utilizing a bond between silicon and hydrogen for introducing functional side chains therein.

While a patternable material using a POSS compound is described in Reference 1, the disclosed method, that is, the method of introducing a functional group into the POSS compound encounters the problem that an attempt to introduce sterically bulky substituent groups as the functional group using a short spacer would fail to introduce them at entire positions available for substitution. Although it is suggested to derive POSS compounds from SSQ compounds having functional groups, how to implement is not disclosed at all. This technique relates to a patternable composition for forming a low dielectric constant layer. In an attempt to formulate the same as a resist composition having higher resolution, it is difficult to form a microscopic structure for the reason that the length of acid diffusion during pattern formation is increased if a film-forming material has a low glass transition temperature (Tg). Then, in order for this composition to serve as a resist composition with high resolution, it must have a Tg above a certain level. It is preferred to this end that all substituent groups be bulky substituent groups with a short spacer, and possibly without a spacer.

As discussed above, SSQ having a degree of condensation of substantially 100% can have an elevated Tg by introducing side chains of sterically bulky structure so that it becomes an appropriate material for forming a microscopic structure by lithography. In an attempt to introduce bulky side chains into a compound having POSS skeleton by the method disclosed in Reference 1, however, the rate of introduction is restricted.

A list of references includes JP-A 212983 (Reference 1), JP-A 2004-359669, JP-A 5-97719, JP-A 2000-506183, JP-A 2002-55456, JP-A 2004-354417, and Journal of Photopolymer Science and Technology, 18, 631-639, 2005.

DISCLOSURE OF THE INVENTION

An object of the present invention is to provide a mixture of silsesquioxane compounds having a degree of condensation of substantially 100% and suited for use in resist compositions, the SSQ compounds possessing a stereospecific norbornane structure in direct bond to a silicon atom as the substituent group on silicon which is effective for SSQ compounds to have an elevated Tg and improved etch resistance as well as a degree of condensation of substantially 100%; a hydrolyzable silane compound; methods for preparing the foregoing compounds; a resist composition comprising the SSQ mixture; a patterning process and a substrate processing process using the composition.

The norbornene skeleton the bulky side chain possesses in Reference 1 can be readily produced through Diels-Alder reaction of a cyclopentadiene or furan compound with an acrylate or vinyl derivative. By imparting various functional side chains to the parent diene, relatively many variants are obtainable in a simple manner. Many such variants are thus used as a source component in commonly used silicon-free resist compositions and also as a side chain on linear organosilicone resins. As pointed out above, however, when bulky side chains are introduced into a compound having POSS skeleton, the rate of introduction is restricted.

In this regard, the inventors discovered that by subjecting a trifunctional hydrolyzable silane monomer having a bulky side chain to two stages of hydrolysis and condensation and controlling the amount of water within the reaction system during the condensation, a condensation product which contains a higher proportion of SSQ compounds having a degree of condensation of substantially 100% and is suited for use in positive resist compositions is readily obtained in high yields, and filed a patent application U.S. Ser. No. 11/393,911 (corresponding to Japanese Patent Appln. No. 2006-084411 or JP-A 307180).

For SSQ compounds having a degree of condensation of 100%, exemplary frameworks include those of 6 to 12 monomer units shown below.

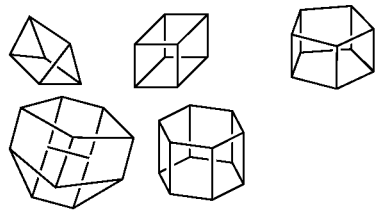

Herein, each apex denotes a silicon atom having one substituent group, and each side denotes a Si—O—Si linkage.

When a bulky side chain is introduced into the aforementioned compound having POSS skeleton, a high rate of introduction of bulky substituent groups cannot be achieved unless the method of our proposal is employed. When the method of our proposal is employed, however, the resulting reaction mixture contains some incompletely condensed components. It is awkward in practice to remove the incompletely condensed components by purification or the like. To enhance the stability of the reaction mixture, a measure capable of increasing the degree of condensation of an overall system during the condensation reaction is thus desired.

We continued investigations on the synthesis of SSQs possessing a norbornane or oxanorbornane skeleton that is a bulky substituent group as a side chain and that ensures relatively high Tg so that they are potentially useful in resist compositions, and having a degree of condensation of substantially 100%, through hydrolytic condensation of hydrolyzable silane derivatives disclosed in our preceding patent application, and achieved a significant degree of condensation. However, a certain limit was imposed to the ultimate degree of condensation because the bulkiness, on the other hand, interfered with the reactivity of condensation reaction. We thus reconsidered the material subject to condensation.

Norbornene derivatives possessing a functional side chain (including not only a monovalent substituent group, but also a divalent (i.e., cyclic structure-forming) side chain) generally have that functional side chain on a dimethylene chain, i.e., at 5- and/or 6-carbon, and from the steric standpoint, include two stereoisomers in which the substituent group assumes an exo or endo configuration. However, the method of synthesis of norbornene derivatives from commonly used cyclohexadiene compounds and vinyl compounds almost produces, in most cases, an endo isomer as a main product. Notably, Reference 1 proposes the structure in which a norbornene derivative is bonded to a silicon atom, but does not disclose in a substantial sense how to introduce into SSQs having a degree of condensation of 100%. It refers nowhere to an exo isomer.

Continuing efforts with a highlight on the stereoisomerism, we have found that when a norbornene derivative mixture in which an isomer having a bulky substituent group substituted at an exo position is predominant (in the specification, for convenience sake, the presence of only one isomer is also referred to as "mixture") is selected and used as the norbornane skeleton reactant to be introduced onto a silicon atom, an improvement in reactivity is achieved without losing the effect of bulkiness. Specifically, when this mixture is applied to our preceding patent application, the degree of condensation can be readily increased over the entire system. This is also advantageous in increasing the production yield of SSQ derivatives having a degree of condensation of 100%. In addition, this mixture causes little hindrance of reaction by stericity while retaining bulkiness. The use of a norbornene having a substituent group substituted at an exo position allows for advantageous progress of reaction when a side chain is introduced into a POSS compound having hydrogen as a substituent group as disclosed in Reference 1.

Accordingly, the present invention provides a SSQ compound mixture, a hydrolyzable silane compound, and methods for preparing the both, a resist composition, and a patterning process and a substrate processing process.

[1] A mixture of silsesquioxane compounds comprising silsesquioxane units having a side chain including a direct bond between a silicon atom and a norbornane skeleton in which some methylene groups may be replaced by oxygen atoms and having a degree of condensation of substantially 100%, wherein a dimethylene chain of the norbornane skeleton remote from the silicon bonded side is substituted with at least one substituent group other than hydrogen, and an isomer having a bulkier substituent group on said dimethylene chain at an exo position is present in a higher proportion.

[2] The silsesquioxane compound mixture of [1] which is obtained by a synthesis process comprising introducing a side chain onto a silicon atom, using a reactant for forming a direct bond between a silicon atom and a norbornane skeleton in which some methylene groups may be replaced by oxygen atoms, said reactant being a norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms.

[3] The silsesquioxane compound mixture of [1] which is obtained through hydrolytic condensation of a trifunctional hydrolyzable silane comprising a silane monomer having three silicon-bonded hydrolyzable groups, said silane monomer being obtained by a process using a reactant for forming a direct bond between a silicon atom and a norbornane skeleton in which some methylene groups may be replaced by oxygen atoms, said reactant being a norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms.

[4] The silsesquioxane compound mixture of [1] which is obtained by reacting a silsesquioxane compound bearing hydrogen as substituent groups and having a degree of condensation of substantially 100% with a norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms.

[5] The silsesquioxane compound mixture of [1] which is obtained by a process using a reactant for forming a direct bond between a silicon atom and a norbornane skeleton, said reactant being a norbornene derivative in which a dimethylene chain has substituted thereon at least one substituent group other than hydrogen, and some methylene groups may be replaced by oxygen atoms, provided that the norbornene derivative has been treated so as to increase the proportion of an isomer having a bulkier substituent group at an exo position.

[6] The silsesquioxane compound mixture of [5] wherein the treatment to increase the proportion of an isomer having a bulkier substituent group at an exo position includes an isomerization reaction between exo and endo positions.

[7] The silsesquioxane compound mixture of [5] or [6] wherein the treatment to increase the proportion of an isomer having a bulkier substituent group at an exo position includes a fractionation between exo and endo isomers.

[8] The silsesquioxane compound mixture of any one of [1] to [7] wherein the silsesquioxane compounds have a functional group which imparts substrate adhesion to the molecule and/or a functional group which is protected with an acid-labile protective group, but imparts an alkali solubility to the molecule upon deprotection.

[9] The silsesquioxane compound mixture of any one of [1] to [8] wherein said norbornane skeleton has a functional group which imparts substrate adhesion to the molecule or a functional group which is protected with an acid-labile protective group, but imparts an alkali solubility to the molecule upon deprotection.

[10] A hydrolyzable silane compound comprising a silicon atom having directly substituted thereon a norbornane skeleton in which some methylene groups may be replaced by oxygen atoms, said compound being obtained through reaction of a hydrolyzable hydrosilane compound with a norbornene derivative in which a dimethylene chain has substituted thereon at least one substituent group other than hydrogen, and some methylene groups may be replaced by oxygen atoms, provided that the norbornene derivative has been treated so as to increase the proportion of an isomer having a bulkier substituent group at an exo position.

[11] The silsesquioxane compound mixture of [10] wherein the treatment to increase the proportion of an isomer having a bulkier substituent group at an exo position includes an isomerization reaction between exo and endo positions.

[12] The silsesquioxane compound mixture of [10] or [11] wherein the treatment to increase the proportion of an isomer having a bulkier substituent group at an exo position includes a fractionation between exo and endo isomers.

[13] A method for preparing a mixture of silsesquioxane compounds having a degree of condensation of substantially 100% as set forth in [1], comprising hydrolytic condensation of a trifunctional hydrolyzable silane comprising a silane monomer having three silicon-bonded hydrolyzable groups, said silane monomer being prepared using a reactant for forming a direct bond between a silicon atom and a norbornane skeleton in which some methylene groups may be replaced by oxygen atoms, said reactant being a norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms.

[14] A method for preparing a mixture of silsesquioxane compounds having a degree of condensation of substantially 100% as set forth in [1], comprising reacting a silsesquioxane compound bearing hydrogen as substituent groups and having a degree of condensation of substantially 100% with a norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms.

[15] The method of [13] or [14], wherein said norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms is obtained by treating a norbornene derivative in which a dimethylene chain has substituted thereon at least one substituent group other than hydrogen, and some methylene groups may be replaced by oxygen atoms, so as to increase the proportion of an isomer having a bulkier substituent group at an exo position.

[16] The method of [15] wherein the treatment to increase the proportion of an isomer having a bulkier substituent group at an exo position includes an isomerization reaction between exo and endo positions.

[17] The method of [15] or [16] wherein the treatment to increase the proportion of an isomer having a bulkier substituent group at an exo position includes a fractionation between exo and endo isomers.

[18] A method for preparing a mixture of silsesquioxane compounds having a degree of condensation of substantially 100%, comprising hydrolytic condensation of a silane feed containing a trifunctional silane bearing a bulky substituent group on side chain represented by the general formula (1).

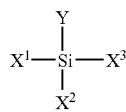
(1)

Herein Y is an organic group of 3 to 20 carbon atoms, optionally having a functional group selected from among halogen, oxygen and sulfur atoms, containing an aliphatic branched, cyclic or polycyclic structure in which the atom at the silicon-bonding site is a carbon having at least two bonds with atoms other than hydrogen and halogen atoms in addition to said silicon, or an organic group of 6 to 18 carbon atoms, optionally having a functional group selected from among halogen, oxygen and sulfur atoms, containing an aromatic structure having a substituent group other than hydrogen and halogen atoms at a vicinal site to the silicon-bonding site, said organic groups being derived from at least one norbornene derivative in exo isomer form as isolated or from a norbornene derivative mixture in which an exo isomer is present in excess of an endo isomer or which has been treated so as to increase the proportion of an exo isomer; $X^1$, $X^2$ and $X^3$ are each independently a hydrogen atom, halogen atom, straight, branched or cyclic alkoxy group of 1 to 6 carbon atoms, or aryloxy group of 6 to 10 carbon atoms.

[19] A method for preparing a mixture of silsesquioxane compounds having a degree of condensation of substantially 100%, comprising hydrolytic condensation of a silane feed containing at least one hydrolyzable silane monomer selected from (A) monomer units having the general formula (2) and (B) monomer units having the general formula (3).

(2)

(3)

Herein $R^1$ is an organic group containing an aliphatic branched, cyclic or polycyclic structure of 3 to 20 carbon atoms, optionally containing a halogen (e.g., fluorine), oxygen or sulfur atom, in which the atom at the silicon-bonding site is a carbon having at least two bonds with atoms other than hydrogen and halogen atoms in addition to said silicon, or an organic group of 6 to 18 carbon atoms, optionally having a functional group selected from among halogen, oxygen and sulfur atoms, containing an aromatic structure having a substituent group other than hydrogen and halogen atoms at a vicinal site to the silicon-bonding site, the organic groups being capable of imparting adhesive nature to the molecule; $R^2$ is an organic group containing an aliphatic branched, cyclic or polycyclic structure of 3 to 20 carbon atoms in which the atom at the silicon-bonding site is a carbon having at least two bonds with atoms other than hydrogen and halogen atoms in addition to said silicon, said organic group having as a functional group a group which is protected with an acid labile protective group, but imparts alkali solubility to the molecule upon deprotection, and optionally further containing a halogen, oxygen or sulfur atom, or an organic group of 6 to 18 carbon atoms, optionally having a functional group selected from among halogen, oxygen and sulfur atoms, containing an aromatic structure having a substituent group other than hydrogen and halogen atoms at a vicinal site to the silicon-bonding site, at least one of $R^1$ and $R^2$ being a substituent group containing a higher proportion of an exo isomer; $X^1$ and $X^2$ are each independently hydrogen, halogen or straight, branched or cyclic alkoxy group of 1 to 6 carbon atoms.

[20] The method of any one of [13] to [19], wherein the hydrolytic condensation comprises a first stage wherein the silane feed is hydrolyzed in the presence of an acid or base catalyst, and a second stage wherein dehydrating condensation reaction is carried out in the presence of at least 0.5 mol % based on the silane feed of a strong base catalyst while removing the water resulting from condensation out of the reaction system or while using an organic solvent in an amount of at least two times the weight of hydrolyzates resulting from hydrolysis and allowing the water resulting from condensation to transfer to the organic solvent.

[21] A method for preparing a hydrolyzable silane compound comprising a silicon atom having directly substituted thereon a norbornane skeleton in which some methylene groups may be replaced by oxygen atoms, said method comprising treating a norbornene derivative in which a dimethylene chain has substituted thereon at least one substituent group other than hydrogen, and some methylene groups may be replaced by oxygen atoms, so as to increase the proportion of an isomer having a bulkier substituent group at an exo position, and reacting a hydrolyzable hydrosilane compound with the treated norbornene derivative.

[22] The method of [21] wherein the treatment to increase the proportion of an isomer having a bulkier substituent group at an exo position includes an isomerization reaction between exo and endo positions.

[23] The method of [21] or [22] wherein the treatment to increase the proportion of an isomer having a bulkier substituent group at an exo position includes a fractionation between exo and endo isomers.

[24] A resist composition comprising the silsesquioxane compound mixture of any one of [1] to [9].

[25] The resist composition of [24], which is a chemically amplified positive resist composition.

[26] A micropatterning process comprising using the resist composition of [24] or [25] to form a resin pattern.

[27] A process for processing a substrate, comprising forming a fine pattern on a substrate by the patterning process of [26], and processing the substrate by plasma etching through the fine pattern serving as an etching mask.

It should be understood that a silsesquioxane bearing hydrogen as a substituent group and having a degree of condensation of 100% is, for example, of the structure shown below:

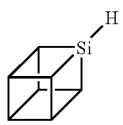

(wherein each apex denotes a silicon atom, and each side denotes a Si—O—Si linkage) wherein the group (other than oxygen) bonded to either silicon atom in the Si—O—Si linkage is a hydrogen atom, that is, each apex is Si—H. This SSQ can be converted through hydrosilylation into a SSQ having a direct bond between a norbornane skeleton and a silicon atom, as shown by the following reaction scheme.

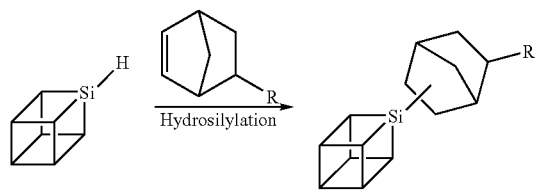

BENEFITS OF THE INVENTION

The present invention provides a SSQ compound or a mixture of SSQ compounds having a degree of condensation of substantially 100%, which can be advantageously used in resist compositions, especially chemically amplified positive resist compositions. In one preferred embodiment wherein SSQ compounds having a degree of condensation of 100% are synthesized through condensation of functional silanes, a reaction product mixture having a low silanol content which is advantageous for shelf stability is yielded. This is also advantageous for the yield of SSQ compounds having a degree of condensation of 100%. When a functionality is introduced into SSQ having a degree of condensation of 100%, on the other hand, this facilitates such introduction, imparting high dissolution contrast, high substrate adherence or the like. In addition, a resist composition comprising a SSQ compound mixture having a degree of condensation of 100% prepared by the present invention offers a high resolution and especially high performance in forming repetitive microscopic size patterns, in contrast to prior art compositions comprising those having side chains having a high degree of freedom relative to thermal motion used in the method of introduction after condensation, those having bulky substituent groups, and those having an insufficiently increased degree of condensation.

DESCRIPTION OF THE PREFERRED EMBODIMENTS

It is noted that the terms "a" and "an" herein do not denote a limitation of quantity, but rather denote the presence of at least one of the referenced item. Several abbreviations are used, SSQ stands for silsesquioxane and POSS stands for polyhedral oligomeric silsesquioxane.

First, the norbornene derivatives used herein are described.

In general, synthesis of norbornene and oxanorbornene derivatives having a substituent group on a dimethylene chain is effected by Diels-Alder reaction. It is well known that in the most typical example where cyclopentadiene is reacted with an acrylate, the reaction occurs in endo-cis form, selectively yielding an endo isomer. Likewise, when cyclopentadiene is reacted with a dienophile free of a conjugated system, such as allyl bromide, a mixture of isomers is yielded due to incomplete selectivity, but the major product is an endo isomer. This result generally remains unchanged even when a furan derivative having an oxygen atom within the ring is used as the diene and when reaction is accelerated by a catalyst such as Lewis acids. Then, any special measure must be taken if it is desired to use an isomer in which a substituent group is at exo position or in the event two substituent groups substitute, an isomer in which a bulkier substituent group is at an exo position, alone or a mixture in which the exo isomer is predominant, or if it is desired to use a mixture in which an endo isomer is still predominant, but an exo isomer is present in an increased ratio, even by a little, as compared with those produced by an ordinary method.

One measure which utilizes a reaction that a bulky substituent group occupies an exo position due to electronic interaction or the like is to previously design a starting norbornene derivative such that in the resulting norbornene derivative available as a main product, the bulky substituent group may come in the exo position. As used herein, the term "norbornene derivative" refers to not only products from cyclopentadiene derivatives, but also products from furan derivatives. In one exemplary method, for example, α-substituted acrylic acid derivatives or ester derivatives having a bulkier substituent group than the carboxylic acid or ester moiety are used as the dienophile. Then, the electronic interaction between a conjugated ester as the dienophile and a cyclic diene causes the carbonyl group to take an endo position and accordingly, the bulky substituent group comes in an exo position.

A variant that does not rely on selectivity due to interaction of a conjugated system is to alter steric selectivity by the strong electronic effect of fluorine as will be described below. For example, when Diels-Alder reaction is effected between α-fluoroacrylic fluoride and cyclopentadiene, a compound having a bulky fluorocarbonyl group at an endo position and less bulky fluorine at an exo position becomes the major product. See Journal of Photopolymer Science and Technology, 18, 631-639, 2005. Although it is reported that the fluorocarbonyl group is further converted into a hexafluoroisopropanol group by chemical conversion, the compound can also be converted into an ester derivative.

Another measure is to isolate or concentrate a derivative having a bulky substituent group at an exo position. Since exo and endo derivatives generally have different physical properties, it is possible to separate isomers or to increase a mixing proportion of one isomer by adsorption or partition chromatography under selected conditions.

Where isomers have different crystallinity, preferential crystallization of one isomer is sometimes possible. In such an event, one derivative can be isolated through the crystallization step, or when it is not completely isolated, its mixing proportion can be increased. Even when an isomer that preferentially crystallizes is not the desired one, the desired isomer can be concentrated in the mother liquid by removing the crystal. One such example is a norbornene dicarboxylic anhydride. By subjecting a norbornene dicarboxylic anhydride resulting from Diels-Alder reaction to thermal isomerization and then to crystallization, JP-A 2004-359669 succeeded in achieving a higher mixing ratio of exo position than that following isomerization.

Where isomers have different boiling points, an isomer having a lower or higher boiling point can naturally be concentrated by effecting distillation and fractionation. For example, when a tetracyclododecene derivative is subjected to gas chromatography, isomers having a norbornane skeleton in exo and end forms largely differ in retention time, due to the difference of boiling point. Since the exo isomer has a lower boiling point in this example, the exo isomer can be concentrated by separating off the low boiling fraction.

A further measure is to treat a norbornene derivative under sufficient conditions to allow for inversion of configuration, for thereby increasing the ratio of exo isomer. When a comparison is made between an isomer having a bulky substituent group substituted at exo position and an isomer having a bulky substituent group substituted at endo position, the isomer having a bulky substituent group substituted at endo position naturally produces a greater stereo-repulsion between the substituent group and the methine constituting an unsaturated bond. Then, if any suitable means is taken so that the carbon to which the substituent group is attached is allowed for inversion of configuration, the mixing ratio of the exo isomer which produces less stereo-repulsion and is thermodynamically advantageous can be increased. It is reported that an exemplary compound wherein the substituent group is an aromatic group is subjected to inversion of configuration in the presence of a solid catalyst such as silica or alumina or a solid acid catalyst having a sulfonic acid side chain (JP-A 5-97719). Also, when the substituent group is a carbonyl group, as in the case of the aforementioned norbornene anhydride, inversion of configuration can be invoked only by heating (JP-A 2004-359669), although the inversion can be activated by addition of bases such as tertiary amines or use of buffers. Similarly, in the case of phenylcyclododecene, isomerization into an exo isomer can be effected by heating (JP-A 2000-506183).

With respect to the norbornene compound which is designed such that an exo isomer becomes the major product as mentioned above, or the norbornene compound obtained by separation, an exo isomer alone or a mixture in which an exo ratio is increased than before the separation, or a mixture in which a mixing ratio of an exo isomer is increased by a treatment involving inversion of configuration than before the treatment is mitigated in the interference of a bulky substituent group with the reaction of norbornene double bond, and thus offers a higher reactivity than otherwise.

The synthesis of the aforementioned SSQ derivatives having a degree of condensation of 100% including POSS compounds having a functional side chain includes (1) a method of synthesizing a SSQ derivatives having a degree of condensation of 100% and introducing a functional side chain therein, (2) a method of hydrolyzing a trifunctional hydrolyzable silane compound having substituted thereon a side chain having the function of a non-hydrolyzable side chain, and (3) an intermediate method of cutting some oxygen-silicon bonds in a SSQ derivative having a degree of condensation of 100%, exchanging with a silane having a functional side chain, and effecting re-condensation. As used herein, the term "trifunctional hydrolyzable silane compound" refers to a silane compound having three hydrolyzable groups, e.g., alkoxy groups, attached to silicon atoms. In any of these methods, a norbornene compound having a bulky side chain at exo position that is a steric isomer having improved reactivity despite the bulky side chain can be advantageously used.

Now, it is described how to introduce a norbornene compound side chain after a SSQ skeleton having a degree of condensation of 100% is formed. The SSQ skeleton having a degree of condensation of 100% may be efficiently prepared in a high purity by subjecting a trifunctional hydrolyzable silane having generally a single side chain or side chains of closely similar shape to hydrolytic condensation under suitable solvent conditions, and maintaining an equilibrium state between condensation and de-condensation during maturation, whereby a SSQ having symmetry, crystallization tendency and a degree of condensation of 100% precipitates as crystals. This method is difficult to introduce a side chain having more than one function. Once a symmetric compound is obtained, the side chain is converted. The simplest method is the use of a SSQ having a functional group capable of forming a new bond and a degree of condensation of 100% as described in Reference 1. In Reference 1, the side chain is converted into a functional side chain by using a dimethylsilyloxy group as the bond-forming functional group, and reacting an olefin with a silicon-hydrogen bond. As the bond-forming functional group, an octahydrosilsesquioxane which is a derivative having hydrogen substituted on silicon is now available, for example, from Hybrid Plastics. Using this compound, a functional group can be introduced, without inserting a spacer, by the method of Reference 1. If the functional side chain is sterically bulky, it is presumed difficult to introduce such chains at all eight positions or to achieve high yields. The use of an isomer having a bulky substituent group at exo position or an isomer mixture having a high or increased ratio of exo position can be a solution to the problem associated with low reactivity.

The intermediate method involves cutting some oxygen-silicon bonds in a SSQ derivative having a degree of condensation of 100% and exchanging with a silicon having a different side chain. Since the introduction of a different functional side chain or a plurality of side chains into a common molecule is certainly limited from the methodology aspect, this method can be applied to resist compositions only with the accompanying difficulty. With this method, it is also fairly difficult to drive the condensation of SSQ having a sterically bulky substituent group to completion, as will be described later. However, it is understood from the results described later that when a silicon exchange is performed using a trifunctional hydrolyzable silane having substituted thereon a norbornane with a functional side chain, re-condensation is easy as long as the side chain is an exo isomer.

The other method of synthesizing a SSQ derivative containing a norbornane side chain and having a degree of condensation of 100% is by hydrolyzing a trifunctional hydrolyzable silane compound having substituted thereon a norbornane side chain having the function of a non-hydrolyzable side chain. In this method, a hydrolyzable silane having a norbornane side chain is first synthesized from a norbornene derivative and a trifunctional hydrolyzable hydrosilane. Since the hydrolyzable hydrosilane has a relatively high reactivity, a reactivity problem based on stereo-structure does not arise at this stage. However, an attempt to effect condensation reaction into a SSQ having a degree of condensation of 100% revealed the effect of improving reactivity based on stereo-structure. Thus this method is described in further detail.

The method of the invention utilizes the inventors' discovery that when a trifunctional hydrolyzable silane having substituted directly thereon a norbornane side chain is used wherein a bulky substituent group in the form of the norbornane side chain is at an exo position of stereo-structure, condensation reaction into a cage molecule proceeds effectively as compared with the case where the bulky substituent group is at an endo position of stereo-structure. A trifunctional hydrolyzable silane having a norbornane side chain attached directly to silicon, which is obtained by a well-known hydrosilylation technique (see, e.g., JP-A 2002-55456) using a norbornene derivative obtained by the aforementioned method and a trifunctional hydrolyzable hydrosilane, is used as a reactant for condensation. Using this as the reactant for condensation, a proportion of SSQ compounds having a degree of condensation of 100% in a mixture of SSQ compounds having a degree of condensation of 100% which is a condensation product can be improved, as compared with the case where the norbornene derivative obtained by the aforementioned method is not used.

Then, the hydrolytic condensation conditions under which a SSQ compound having a degree of condensation of 100% is derived from a trifunctional hydrolyzable silane compound are not particularly limited. The method of bringing a degree of condensation closer to 100% includes, for example, the method of JP-A 2004-354417 and the method of U.S. Ser. No. 11/393,911, with the latter being more advantageous. In order that the SSQ compound be useful in chemically amplified resist compositions, a compound having substituted thereon as the side chain any one of numerous well-known functional side chains necessary for the positive type may be used in the positive application, and a similar choice may be made in the negative application. It is noted that this method allows a high degree of freedom for the design of the desired compound, as compared with the former two methods, because a choice of the type and ratio of substituent group to be introduced well reflects the state of a mixture of trifunctional hydrolyzable silane compounds used.

When a material having a high mixing proportion of a SSQ compound having a degree of condensation of 100% is used alone to formulate a positive resist composition, a high resolution of a fine line-and-space pattern is achieved probably due to the effect of molecular size uniformity, as will be described later. When a SSQ compound having a degree of condensation of 100% is used in positive resist compositions, a derivative having on its side chain a functional group which imparts adhesion to substrates or the like or a functional group which is protected with an acid labile protective group, but imparts alkali solubility to the molecule upon deprotection and preferably, both may be used. Notably, the functional group used for each function may be of one type, or a plurality of functional groups may be used for one function. Alternatively, mixtures of SSQ compounds with a degree of condensation of 100% having different functional groups or different functional group ratios may be used in blend.

Better results are obtained as long as the trifunctional hydrolyzable silane obtained from an exo isomer of norbornene derivative as isolated, or a norbornene derivative mixture which contains an exo isomer in excess of an endo isomer or has been treated so as to increase the mixing ratio of an exo isomer is used as part of the reactant in the condensation reaction. Also, as will be described later, condensation reaction does not proceed extremely unevenly unless a silane having a sterically less bulky substituent group is added above a certain level during hydrolytic condensation. In order that a SSQ derivative mixture with a degree of condensation of 100% having high uniformity in the type and number of substituent groups the molecule possesses be produced by making the size of substituent groups uniform, all hydrolyzable silanes used in hydrolytic condensation should preferably be selected from those obtained from norbornene derivatives, at least one of which is a hydrolyzable silane obtained from an exo isomer of norbornene derivative as isolated, or a norbornene derivative mixture which contains an exo isomer in excess of an endo isomer or has been treated so as to increase the mixing ratio of an exo isomer.

The method of obtaining a mixture of SSQ compounds with a degree of condensation of 100% includes the following method, which has already been disclosed as the preferred embodiment in U.S. Ser. No. 11/393,911.

Specifically, the trifunctional hydrolyzable silane used in hydrolytic condensation is a silane feed comprising a trifunctional silane bearing a bulky substituent group on side chain represented by the general formula (1):

wherein Y is an organic group of 3 to 20 carbon atoms, optionally having a functional group selected from among halogen (e.g., fluorine), oxygen and sulfur atoms, containing an aliphatic branched, cyclic or polycyclic structure in which the atom at the silicon-bonding site is a carbon having at least two bonds with atoms other than hydrogen and halogen atoms in addition to said silicon, or an organic group of 6 to 18 carbon atoms, optionally having a functional group selected from among halogen (e.g., fluorine), oxygen and sulfur atoms, containing an aromatic structure having a substituent group other than hydrogen and halogen atoms at a vicinal site to the silicon-bonding site, said organic groups being derived from an exo isomer of at least one norbornene derivative isolated or from a norbornene derivative mixture in which an exo isomer is present in excess of an endo isomer or which has been treated so as to increase the mixing proportion of an exo isomer; $X^1$, $X^2$ and $X^3$ are each independently a hydrogen atom, halogen atom, straight, branched or cyclic alkoxy group of 1 to 6 carbon atoms, or aryloxy group of 6 to 10 carbon atoms. It is noted that while similar definition is employed throughout the specification, the number of carbon atoms refers to that of the skeleton and does not include the carbon atoms in functional groups and other substituent groups.

One or more silanes of formula (1) may be used. Preferably, at least one silane should be a silane of formula (1) wherein Y has a structure including a direct bond between a silicon atom and a norbornene skeleton in which some methylene groups may be replaced by oxygen atoms, a dimethylene chain is substituted with at least one substituent group other than hydrogen, and an isomer having a bulkier substituent group on the dimethylene chain at an exo position is present in a higher proportion.

If the majority of starting material is a hydrolyzable silane (serving as substrate) having a sterically less bulky side chain, that is, a side chain where the silicon-bonding carbon has less than or equal to one bond with atoms other than hydrogen and halogen, there is an increased tendency that higher oligomers form preferentially during condensation. The method improves the rate of condensation of the overall system even when condensation reaction is effected at a low water concentration, but is difficult to increase the proportion of SSQ compounds having a degree of condensation of substantially 100%. On the other hand, if the silane feed is a silane in which the silicon-bonding carbon on side chain is a carbon having at least three bonds with atoms other than hydrogen and halogen, inclusive of that silicon, especially a carbon in the aforementioned norbornane skeleton, a tertiary carbon, or a carbon to constitute an aliphatic cyclic or condensed ring skeleton including a norbornane skeleton other than the foregoing, or the silicon-bonding carbon is an atom to constitute an aromatic ring and has a substituent group other than hydrogen and halogen substituted at its vicinal site, it can be utilized very advantageously. If the proportion of such trifunctional silane is at least 70 mol %, preferably at least 90 mol %, more preferably 100 mol %, the inventive method is successful in increasing the proportion of SSQ compounds having a degree of condensation of 100%, especially cage shaped octet, in the SSQ compound mixture produced.

Preferred examples of Y which will eventually yield a material that can be employed where certain transparency to light of less than or equal to 200 nm is required, or certain resistance to dry etching is required, for example, include, besides norbornane skeleton, side chains of the structure in which silicon is directly bonded to a tricyclodecane skeleton, tetracyclododecene skeleton, bicyclononane skeleton, decalin skeleton, and hetero condensed ring skeleton in which one or more carbon in the foregoing is substituted by one or more oxygen. Examples of the side chain which is effective in increasing the proportion of SSQ compounds having a degree of condensation of 100%, include substituent groups in which the silicon-bonding carbon is tertiary carbon, which are customarily used as the bulky substituent group. Moreover, the effect of bulky substituent group is obtainable even from aromatic substituent groups if a substituent group which is not a small substituent group like hydrogen or fluorine is present at a vicinal site to the silicon-bonding site. This aromatic substituent group is disadvantageous from the standpoint of transparency to light of less than or equal to 200 nm, but provides good resistance to dry etching. Exemplary skeletons for the aromatic substituent group include benzene rings, naphthalene rings, anthracene rings, and partially hydrogenated forms thereof.

While there are many examples of the preferred side chain, the following groups are exemplary of the norbornane skeleton-bearing side chain.

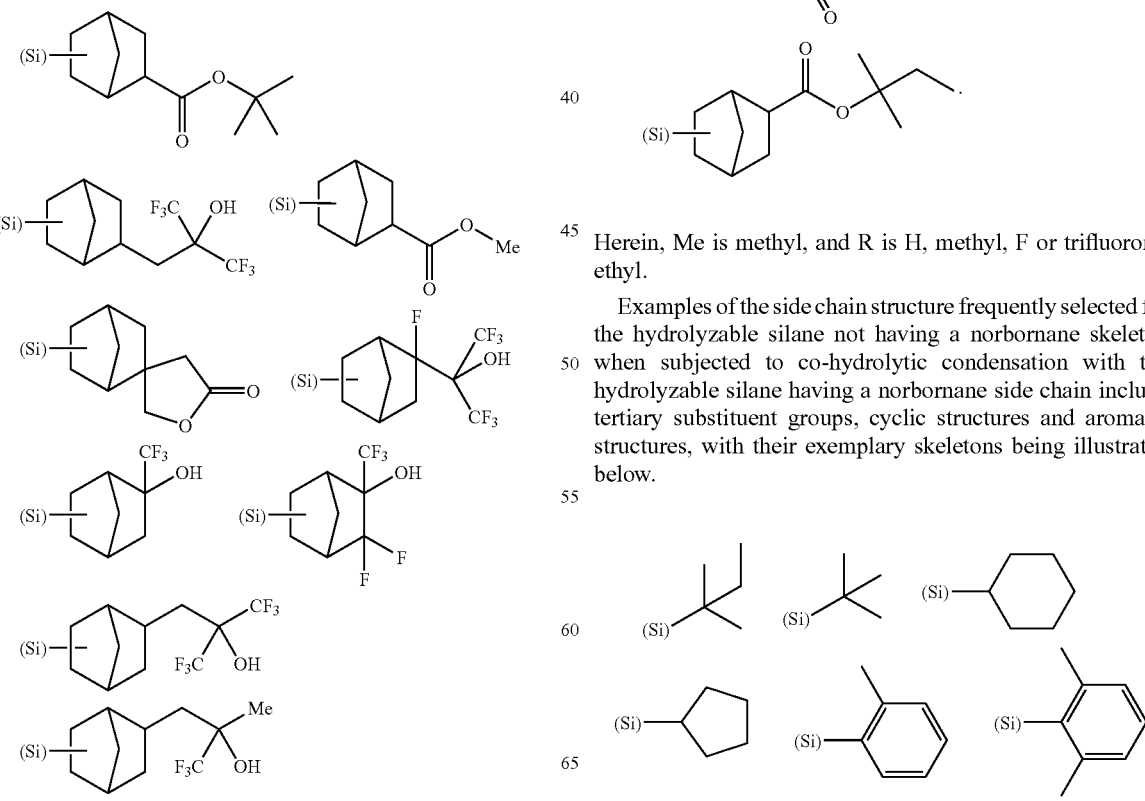

Herein, Me is methyl, and R is H, methyl, F or trifluoromethyl.

Examples of the side chain structure frequently selected for the hydrolyzable silane not having a norbornane skeleton when subjected to co-hydrolytic condensation with the hydrolyzable silane having a norbornane side chain include tertiary substituent groups, cyclic structures and aromatic structures, with their exemplary skeletons being illustrated below.

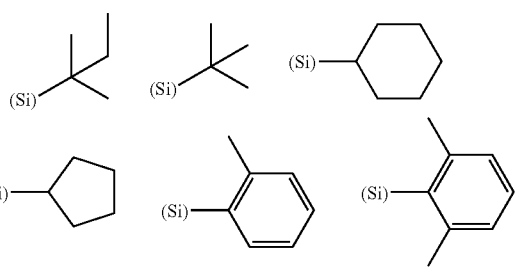

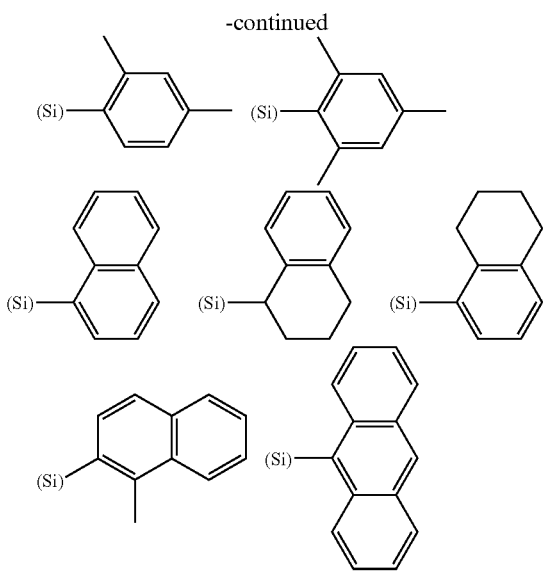

For a better understanding, a structure meaning that the benzene or naphthalene ring structure has a substituent group attached at a vicinal site is illustrated in the above formulae by depicting methyl as a typical substituent group. However, the substituent group is not limited to methyl. A significant bulky effect is achieved particularly when the substituent group is isopropyl or tert-butyl. Also, where the silicon atom is bonded to the naphthalene ring at α-position, the ring to which the silicon atom is not bonded becomes a vicinal substituent group, which corresponds to the bulky substituent group as used herein. This is also true for the anthracene ring.

To produce SSQ compounds having a degree of condensation of 100% in high yields, the above-described silane feed is subjected to a first stage of hydrolysis in the presence of an acid or base catalyst, after which a second stage of dehydrating condensation is carried out in the presence of at least 0.5 mol % based on the silane feed of a strong base catalyst and under specific conditions. This yields a mixture of SSQ compounds having a high proportion of SSQ compounds bearing bulky substituent groups on side chain and having a degree of condensation of substantially 100%.

Problems arise if the condensation reaction is carried out in one stage. For example, if the hydrolyzable silane is a halosilane, a hydrogen halide forms to deactivate the catalyst. If the base is used in excess, preferential formation of a silicate form impedes formation of SSQ compounds (e.g., octets) having a degree of condensation of 100%. If the hydrolyzable silane is an alkoxysilane, hydrolysis forms a large amount of by-product alcohol, which retards the progress of condensation reaction and is detrimental to formation of components having a degree of condensation of 100%. It is thus recommended that hydrolysis reaction in the presence of an acid or alkali catalyst be first carried out and in a second stage, dehydrating condensation of the hydrolyzate in the presence of a strong base catalyst be carried out. In this process, once the hydrolyzate resulting from the first stage of hydrolysis is isolated in a substantially anhydrous state, the amount of water which is produced during condensation reaction and thus introduced into the second stage condensation reaction system is outstandingly reduced whereby the degree of condensation of the overall system is improved. Then, basically, inserting the step of isolating the hydrolyzate between the first and second stages is more effective. In some cases, the isolation operation is omitted, and instead, at an initial phase of the second stage, condensation may be carried out while distilling off the alcohol and excess water. On the other hand, the presence of a very small amount of water is requisite for equilibration reaction due to cleavage/recombination of siloxane bonds by the alkali catalyst. Thus the amount of 100% condensate produced largely depends on the mode of water removal. Specifically, SSQ compounds such as octet having thermodynamically most stable structure are sequentially formed while repeating cleavage and recombination of existing Si—O—Si linkages so that unreacted Si—OH may extinguish in the presence of a smaller amount of water than the moles of the base catalyst admitted.

The feature of the synthesis method, that is, what is needed to increase the proportion of 100% condensate in the SSQ condensates is to carry out condensation reaction while concurrently removing water out of the reaction system. The simplest water removing technique is by azeotropic distillation of water and organic solvent. In a small-scale plant, a large volume of organic solvent is added in advance, and the solvent is withdrawn together with water during the progress of reaction. An alternative procedure involves azeotroping off the organic solvent together with water, separating the water therefrom, and feeding the solvent back to the reaction system. An appropriate procedure may be selected from those procedures well known for ester synthesis through dehydrating condensation. The removal of water accelerates siloxane formation. However, if water is completely eliminated from within the system, water can no longer participate in recombination, impeding formation of 100% condensate. Then, in this case, a small amount of water may be added again, after which condensation reaction may be continued while performing water removal.

It is noted that the formation of SSQ compounds having a degree of condensation of 100% can be demonstrated by separating the reaction mixture after condensation into units by GPC, measuring by Si—NMR, and comparing T1/T2/T3 ratios. Specifically, the mixture is judged to be 100% condensate when no peaks assigned to T1 and T2 are observed and only a T3 signal is observed in the measurement of the smallest unit by Si—NMR. T1, T2 and T3 denote the following units:

T1: formation of one siloxane bond (the remaining two are silanol groups or residual hydrolyzable groups),
T2: formation of two siloxane bonds (the remaining one is a silanol group or residual hydrolyzable group), and
T3: formation of three siloxane bonds (completely condensed units).

The reaction procedure is described in more detail. In the above synthesis method, the first stage of hydrolysis may be carried out in a conventional fashion. Preferably a catalyst is used in an amount of 0.01 to 30 mol % based on the amount of the silane feed, and the amount of water is 150 to 5,000 mol % based on the amount of the silane feed. Useful catalysts include acid catalysts such as acetic acid, hydrochloric acid, sulfuric acid, nitric acid, oxalic acid, citric acid, and p-toluenesulfonic acid, alkali catalysts such as ammonia, NaOH, KOH, methylamine, dimethylamine, trimethylamine, and tetramethylammonium salts, and transition metal catalysts such as acetylacetonatotitanium, Ti(acac). In this case, reaction may also be carried out while adding in addition to water, a hydrophilic organic solvent such as alcohols (e.g., methanol, ethanol, isopropylalcohol), acetone or acetonitrile in an amount of 50 to 1,000% by weight based on the weight of the silane feed. Typically the reaction temperature is 0 to 60° C. and the reaction time is about 30 minutes to about 120 hours.

At the end of hydrolysis, preferably water is removed from the reaction mixture as mentioned above, and more preferably the hydrolyzate is taken out before use in the second stage of reaction. Understandably, depending on a choice of the solvent for hydrolysis reaction in the first stage, a transition from the first stage of hydrolysis to the second stage of condensation can occur via combinations of water removal, catalyst amount adjustment, and the like.

In the second stage of dehydrating condensation, a base catalyst having a lower vapor pressure than the solvent should preferably be chosen while ammonia, triethylamine or the like is less desirable. Preferred are strong alkalis such as alkali hydroxides and quaternary ammonium hydroxide and strongly basic amine catalysts such as 1,8-diazabicyclo [5.4.0]-7-undecene (DBU). A proper choice is made among those amines having higher basicity than 1,4-diazabicyclo [2.2.2]octane (DABCO). The amount of the base catalyst used, which varies with the strength of basicity thereof, is 0.5 to 100 mol %, preferably 5 to 50 mol %, more preferably 10 to 30 mol % based on the monomer units (the silane feed). From the relationship to the reactivity of residual silanol, the hydrolyzate should preferably have such a structure that all silanols can readily react, and therefore, the hydrolyzate should preferably have a relatively low molecular weight of the order of several hundred to thousand.

The feature of the condensation reaction of the invention is, after the first stage of hydrolysis using the above-described silane feed, to carry out a second stage of dehydrating condensation while concurrently removing the water resulting from condensation. In a situation where the water resulting from reaction can impede the progress of dehydrating condensation, it is a well-known measure to carry out condensation while removing the water as formed. In the synthesis of ordinary SSQ polymers, the measure is taken particularly when a higher polymer is desired. Nevertheless, if this measure is applied to condensation of trifunctional hydrolyzable silane compounds having sterically bulky side chains, it is observed that as the degree of condensation increases (or the number of silanols decreases), the proportion of cage shaped SSQ compounds having a degree of condensation of 100% increases rather than the reaction product mixture increases in average molecular weight.

In a relatively large-scale plant, to carry out dehydrating condensation while concurrently removing the water formed, a procedure of using an organic solvent which is separable from water, removing a water/solvent mixture by azeotropic distillation or the like, separating the mixture into water and the solvent, and feeding only the solvent back to the reaction system is efficient. The measure of selection of an organic solvent that enables such operation is that the organic solvent has an azeotropic temperature with water within the temperature range adequate for the reaction and has a solubility of up to 5% of water. Specifically, an organic solvent such as methyl isobutyl ketone, toluene or xylene is preferably used in an amount of 50 to 500% by weight based on the hydrolyzate. When the amount of solvent is increased to or above 200% by weight based on the hydrolyzate, the proportion of cage shaped octet having a degree of condensation of 100% is advantageously increased.

In this case, the cage shaped octet having a degree of condensation of 100% can also be produced in high yields by using an organic solvent for condensation reaction in an amount of at least 200% by weight, or at least two times the weight of the hydrolyzate instead of the step of removing water out of the reaction system, and allowing the water resulting from condensation to transfer to the organic solvent for thereby minimizing the influence of water. It is preferred for ensuring the yield per batch of the target product and from the industrial economy that the upper limit of the solvent is up to 1,000% by weight (up to 10 times).

The reaction temperature is preferably at least 100° C., more preferably at least 115° C. The upper limit of reaction temperature is not particularly specified and when an organic solvent is added, it is the reflux temperature of the solvent. The reaction time is usually at least 8 hours.

The presence of a minor amount of water in the reaction system is essential for isomerization from a high molecular weight SSQ compound to a completely condensed low molecular weight SSQ compound. If the amount of water is extremely reduced, the rate of isomerization reaction is reduced, resulting in an ineffective production method. In this case, a small amount (about 1 to 3 mol % based on the hydrolyzate) of water may be externally added, allowing condensation to continue.

It is noted that in case many substituent groups on silicon atom are not bulky as in the prior art synthesis of SSQ compound having a degree of condensation of 100%, the degree of condensation is improved by carrying out the step of removing water out of the system during condensation reaction as specified under the reaction conditions of the invention, but the formation of cage shaped octet component having a degree of condensation of 100% does not become predominant, and a SSQ compound having a higher average molecular weight would form. Then, to synthesize a component having a degree of condensation of 100%, a method is employed wherein condensation reaction accompanied by equilibration reaction is carried out under conditions containing above a certain level of water for a long time, followed by neutralization and cooling, whereby a highly crystalline complete condensate precipitates as solids. Since the degree of condensation per se is not so high, the benefit is a capability to take out a component having a degree of condensation of 100% through crystallization. It is then difficult to have complex functional groups incorporated prior to the condensation.

In contrast, the present invention is very effective as a method for preparing a SSQ compound which has so bulky organic groups on silicon atoms like the norbornane skeleton that it cannot reach a sufficient degree of condensation under ordinary hydrolytic conditions, and for which an effective synthesis method has not been discovered. When a mixture of trifunctional hydrolyzable silanes which have a somewhat uniform degree of bulkiness around silicon, that is, in which preferably at least 70 mol %, more preferably at least 90 mol % of substituent groups, and most preferably all substituent groups are bulky, is subjected to hydrolysis and condensation as a silane feed, a SSQ compound mixture having a high proportion of 100% condensed SSQ compound can be produced even from those compounds which have so different types of substituent groups that crystallinity is not expectable.

As long as most preferred conditions are selected, the preparation method of the invention can produce the target cage-shaped octet having a degree of condensation of 100% in a high yield of at least 70% as determined by gel permeation chromatography-refractive index (GPC-RI) area ratio. The yield can be further increased using a bulky norbornane derivative having a bulky substituent group at an exo position which is not so disadvantageous sterically, as the reactant.

Since a SSQ compound having a bulky substituent group is less crystalline than a SSQ compound having a small substituent group, crystallization by cooling operation is unsuccessful in most cases. Therefore, when it is desired to further enhance the proportion of 100% condensate in the reaction mixture, a purifying step as by addition of a poor solvent or column passage is often necessary. In this case, the step of removing by fractionation a low condensed fraction from the reaction mixture after the second stage of dehydrating condensation is preferably carried out. For the fractionation, re-precipitation, column partition, GPC partition or the like may be employed.

According to the invention, the above-described method can produce a mixture containing a significantly increased proportion of SSQ compound bearing bulky substituent groups on side chain and having a degree of condensation of substantially 100%. Generally, one of oligomers of 6 to 12 monomer units having a thermodynamically most stable structure due to the size of side chain group (Y), as shown below, typically SSQ octet, can be obtained in a predominant excessive amount.

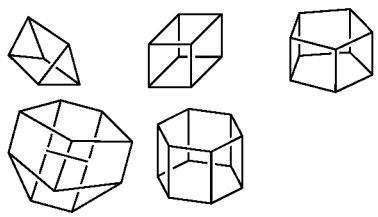

Herein, each apex denotes a silicon atom having one substituent group, and each side denotes a Si—O—Si linkage.

SSQ Compound Mixture

The second embodiment described below is a SSQ compound mixture containing a high proportion of SSQ compound bearing bulky substituent groups and having a degree of condensation of substantially 100%, which was first produced by the method of the invention.

The SSQ compound mixture containing a high proportion of SSQ condensate having a degree of condensation of substantially 100%, which is suitable as one component of a resist composition, is obtainable by using a hydrolyzable silane monomer feed comprising at least one member selected from (A) monomer units having the general formula (2) and (B) monomer units having the general formula (3), preferably at least one member selected from (A) and at least one member selected from (B), and carrying out hydrolysis and condensation in the same manner as in the aforementioned method.

$$R^1—SiX^1_3 \quad (2)$$

$$R^2—SiX^2_3 \quad (3)$$

Herein $R^1$ is an organic group of 3 to 20 carbon atoms containing an aliphatic branched, cyclic or polycyclic structure, optionally containing a halogen (e.g., fluorine), oxygen or sulfur atom, in which the atom at the silicon-bonding site is a carbon having at least two bonds with atoms other than hydrogen and halogen atoms in addition to said silicon, or an organic group of 6 to 18 carbon atoms, optionally having a functional group selected from among halogen (e.g., fluorine), oxygen and sulfur atoms, containing an aromatic structure having a substituent group other than hydrogen and halogen atoms at a vicinal site to the silicon-bonding site, the organic groups being capable of imparting adhesive nature to the molecule; $R^2$ is an organic group of 3 to 20 carbon atoms containing an aliphatic branched, cyclic or polycyclic structure in which the atom at the silicon-bonding site is a carbon having at least two bonds with atoms other than hydrogen and halogen atoms in addition to said silicon, said organic group having as a functional group a group which is protected with an acid labile protective group, but can impart alkali solubility to the molecule upon deprotection, and optionally further containing a halogen, oxygen or sulfur atom, or an organic group of 6 to 18 carbon atoms, optionally having a functional group selected from among halogen (e.g., fluorine), oxygen and sulfur atoms, containing an aromatic structure having a substituent group other than hydrogen and halogen atoms at a vicinal site to the silicon-bonding site; $X^1$ and $X^2$ are each independently hydrogen, halogen or straight, branched or cyclic alkoxy group of 1 to 6 carbon atoms.

At least one of $R^1$ and $R^2$ is a substituent group containing a higher proportion of an exo form isomer. At least one of the silanes used is one in which $R^1$ or $R^2$ has a structure having a direct bond between a silicon atom and a norbornene skeleton in which some methylene groups may be replaced by oxygen atoms, a dimethylene chain of the norbornane skeleton is substituted with at least one substituent group other than hydrogen, and an isomer having a bulkier substituent group on the dimethylene chain at an exo position is present in a higher proportion.

With regard to monomer units (A), examples of the adhesive nature-imparting functional groups represented by $R^1$ include functional groups having a hydroxyl group, carboxyl group, cyclic ether structure, ester structure, α,β-diketone structure or the like. Of these, a structure having a hydroxyl group in which at least three fluorine atoms in total are bonded to one or more carbon atoms bonded to the carbon atom having the hydroxyl group bonded, a carboxylic acid structure, a phenolic hydroxyl structure, and a lactone ring structure are effective. Understandably, the amount of carboxylic acid structure used is limited to a certain level because of strong acidity; and the amount of phenolic hydroxyl structure used is limited because of opaqueness when exposure light of less than or equal to 200 nm is used. Then in the event exposure light of 193 nm is used, for example, the structure having a hydroxyl group in which at least three fluorine atoms in total are bonded to one or more carbon atoms bonded to the carbon atom having the hydroxyl group bonded and the lactone ring structure are more preferred functional groups.

Also, the structure having a hydroxyl group in which at least three fluorine atoms in total are bonded to one or more carbon atoms bonded to the carbon atom having the hydroxyl group bonded is a functional group which is very effective for preventing the resist from swelling during the development step in a patterning process, but tends to detract from resistance to dry etching. Using this structure in combination with the lactone ring structure compensates for this deficiency.

Illustrative examples of the substituent group bearing a structure having a hydroxyl group in which at least three fluorine atoms in total are bonded to one or more carbon is atoms bonded to the carbon atom having the hydroxyl group bonded include substituent groups of the following formulae (A).

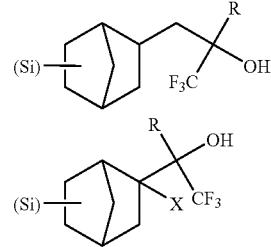

Formulae (A)

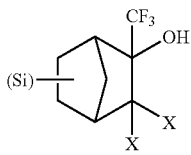

Herein R stands for H, CH$_3$, CF$_3$ or F, and X stands for H or F.

The lactone structure-bearing side chains include those in which a lactone structure is bonded to a cyclic skeleton as a pendant and polycyclic structures a portion of which is a lactone structure. The latter are especially preferred because they are effective for elevating the glass transition temperature. Illustrative examples of such structure are shown below.

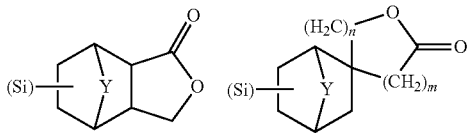

Herein Y is an oxygen atom, sulfur atom or methylene group, n is 0 or 1, and m is 0 or 1.

Other examples of the adhesive functional groups include those of the following structure.

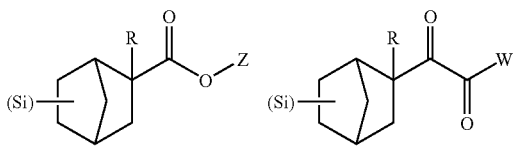

Herein R stands for H, F, CH$_3$ or CF$_3$, and Z and W are each independently an alkyl group of 1 to 6 carbon atoms.

With regard to monomer units (B), the functional groups are substituent groups which impart a function of switching solubility in alkaline aqueous solution to the resin in ordinary resist compositions. They exert a similar function in the SSQ condensate of the invention. For the substituent group R$^2$ having such a function, a number of groups are known in the art. One of the latest publications is JP-A 2005-36146, and the functional groups illustrated therein are applicable to the present invention.

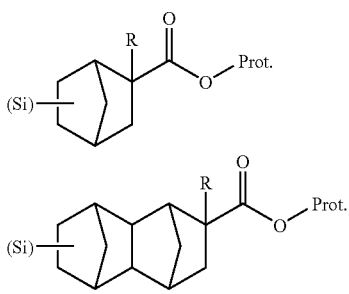

Herein R stands for H, CH$_3$ or F, and Prot. stands for an acid labile group as shown below.

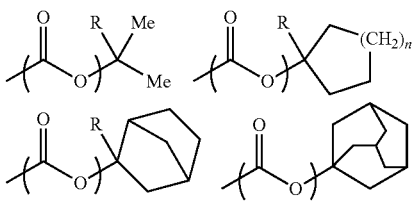

Me is methyl, R is CH$_3$, C$_2$H$_5$, CF$_3$ or F, and n is 1 or 2.

Of these, the acid labile protective group containing a sterically bulky ring structure is most preferred for higher reactivity of acid-induced decomposition.

Although the protected functional group in which the acidic group for acquiring solubility in alkaline water is carboxylic acid has been illustrated above, protected acidic groups are also acceptable having the structure having a hydroxyl group in which at least three fluorine atoms in total are bonded to one or more carbon atoms bonded to the carbon atom having the hydroxyl group bonded. For such groups, the groups shown by the above formulae (A) whose alcohol is protected with a t-BOC (tert-butoxycarbonyl) or acetal group are well known, and they may be used herein as well.

Since the proportion of functional groups necessary for solubility switching depends on the presence or absence of a polymeric or non-polymeric dissolution inhibitor and an alkali-soluble substance to be separately added and the type thereof if present, it is impossible to specify an appropriate range unequivocally. In general, a satisfactory solubility switching function is achievable when formulation is designed such that the functional groups necessary for solubility switching account for at least 10 mol %, more preferably at least 20 mol % of overall functional groups in the SSQ condensate of the invention and other additives. The upper limit is usually up to 90 mol %, especially up to 80 mol %.

To produce a SSQ condensate having a relatively high Tg, the side chain should be such that the carbon at the silicon-bonding site have a sterically bulky environment, and a linker group linking the silicon atom and the above-mentioned functional group should preferably be tertiary or have a substituted ring structure, especially substituted fused ring structure. Preferred examples of these skeletons include norbornane skeletons, tricyclodecane skeletons, tetracyclododecene skeletons, bicyclononane skeletons, decalin skeletons, and hetero fused ring skeletons in which one or more carbon in the foregoing skeletons is replaced by one or more oxygen. Synthesis of monomers to form these compounds is achieved by a combination of well-known functional group modifying reaction, Diels-Alder reaction and hydrosilylation reaction as shown below.

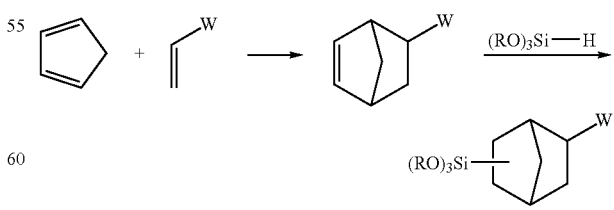

The SSQ condensate mixture in the second embodiment of the invention, which is suitable for use in a positive resist composition, is advantageously produced by the method in the first embodiment.

Specifically, the SSQ compound mixture is produced by using a hydrolyzable silane monomer feed comprising at least one member selected from (A) monomer units having the general formula (2) and (B) monomer units having the general formula (3), preferably at least one member selected from (A) and at least one member selected from (B), and carrying out hydrolysis and condensation in accordance with the aforementioned method.

The monomer units (A) and (B) are preferably used in such amounts that the molar ratio of monomer units (A) to monomer units (B) is 5-100:0-90, and more preferably 10-100:0-80, provided that the total of monomer units is 100.

It is noted that when (B) is 0, that is, the SSQ condensate mixture is used as negative resist, or when the SSQ condensate mixture is used in a resist composition wherein the solubility switching function is allocated to another component, the side chain structure should contain at least five of structures having a hydroxyl group in which at least three fluorine atoms in total are bonded to one or more carbon atoms bonded to the carbon atom having the hydroxyl group bonded, carboxylic acid structures or phenolic hydroxyl structures, rather than consisting of lactone ring structures.

One of preferred combinations is a combination of a monomer having as side chain a structure having a hydroxyl group in which at least three fluorine atoms in total are bonded to one or more carbon atoms bonded to the carbon atom having the hydroxyl group bonded and a monomer having as side chain a lactone structure. When this combination is used as the monomer units (A), it is preferred that the monomer having as side chain a structure having a hydroxyl group in which at least three fluorine atoms in total are bonded to one or more carbon atoms bonded to the carbon atom having the hydroxyl group bonded be 20 to 80 mol %, the monomer having as side chain a lactone structure be 0 to 60 mol % (preferably from more than 0 mol % to 60 mol %), and a monomer having as side chain an acidic functional group structure protected with an acid labile protective group be 20 to 60 mol %.

The silane feed should preferably contain 50 to 100% by weight, more preferably 70 to 100% by weight of the silane of formula (2) and/or the silane of formula (3) combined. There may be included silanes other than the silanes of formulae (2) and (3), examples of which are given below.

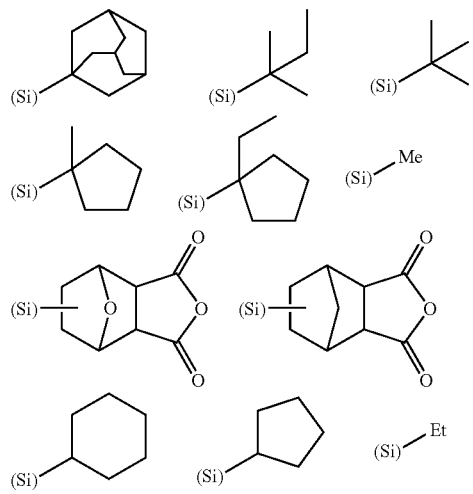

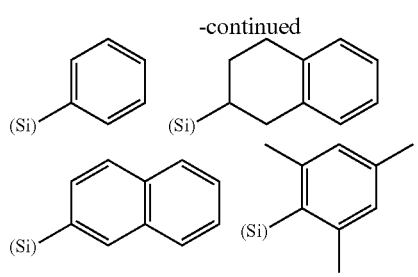

Herein Me is methyl and Et is ethyl.

In the practice of the method of the first embodiment, if a mixture of silanes which have a somewhat uniform degree of bulkiness around silicon is used, hydrolysis and condensation of a mixture of silanes having substituent groups of different type yields a mixture of SSQ compounds having a unit ratio corresponding to the mix ratio of monomers, which mixture has a high proportion of 100% condensed SSQ compound. The above-described design for use as a component in resist composition is possible.

By the method of the first embodiment, the target 100% condensate can generally be produced in a yield of at least 50% as determined by GPC-RI area ratio, and even in a high yield of at least 70% if most preferred conditions are selected. However, since a SSQ compound having a bulky substituent group is less crystalline than a SSQ compound having a small substituent group, crystallization by cooling operation is unsuccessful in most cases. On the other hand, if the product by the inventive method has a degree of condensation of at least 90%, this ensures that 100% condensate is included in the product. The effect of 100% condensate is exerted when the product is formulated into a composition. The preferred ultimate degree of condensation is 95% or higher. It is noted that the degree of condensation can be readily determined by analyzing the crude product by Si—NMR spectroscopy. Namely, the formation of SSQ compound having a degree of condensation of 100% can be demonstrated by separating the reaction mixture after condensation into units by GPC, measuring by Si—NMR, and comparing T1/T2/T3 ratios. Units T1, T2 and T3 are:

T1: formation of one siloxane bond (the remaining two are silanol groups or residual hydrolyzable groups), T2: formation of two siloxane bonds (the remaining one is a silanol group or residual hydrolyzable group), and T3: formation of three siloxane bonds (completely condensed units).

In the above procedure, the identification of each peak on a GPC chart is preceded by isolation by GPC partition. In a general procedure, the proportion of 100% condensate in the SSQ compound mixture produced is determined by using RI as a detector, taking a GPC chart in which specific peaks of 100% condensate appear, and presuming the ratio of the area of the specific peaks to the overall area. For the presumption of the peak area ratio, the vertical partition technique (an area is determined by drawing vertical lines from the bottoms of valleys to the holding time axis) is employed. The assignment of a specific peak to 100% condensate was determined by isolating the peak by GPC partition, measuring by Si—NMR, and confirming the absence of signals assigned to T1 and T2.

It is noted that since the identification of a peak-constituting substance corresponding to the 100% condensate is not done in the general procedure, the peak-constituting substance is referred to as "SSQ having a degree of condensation of substantially 1000%" throughout the specification.

In the event it is desired to obtain 100% condensate of higher purity, when a plurality of substituent groups are incorporated, crystallization is no expectable. However, fractionation using a poor solvent or the like is effective in removing low molecular weight substances. When it is desired to increase the purity above the level achieved by fractionation using a poor solvent or the like, fractionation by GPC or the like must be employed.

The third embodiment of the invention is a SSQ compound mixture comprising at least 40 mol % based on silicon of SSQ octet having a degree of condensation of substantially 100%, in which side chains comprise at least 75 mol % of side chains selected from: organic groups of 3 to 20 carbon atoms containing an aliphatic branched, cyclic or polycyclic structure in which the atom at the silicon-bonding site is a carbon having at least two bonds with atoms other than hydrogen and halogen atoms in addition to said silicon, and which may contain a halogen (inclusive of fluorine), oxygen or sulfur atom, or organic groups of 6 to 18 carbon atoms, optionally having a functional group, containing an aromatic structure having a substituent group other than hydrogen and halogen atoms at a vicinal site to the silicon-bonding site, said organic groups being capable of imparting adhesive nature to the molecule; and organic groups of 3 to 20 carbon atoms containing an aliphatic branched, cyclic or polycyclic structure, optionally containing a halogen (inclusive of fluorine), oxygen or sulfur atom, in which the atom at the silicon-bonding site is a carbon having at least two bonds with atoms other than hydrogen and halogen atoms in addition to said silicon, or organic groups of 6 to 18 carbon atoms, optionally having a functional group, containing an aromatic structure having a substituent group other than hydrogen and halogen atoms at a vicinal site to the silicon-bonding site, said organic groups having as a functional group a group which is protected with an acid labile protective group, but imparts alkali solubility to the molecule upon deprotection. As pointed out above, the SSQ compound mixture having the above-described feature was first produced by the method of the first embodiment. Further, as also described above, in order that a mixture having a higher proportion of SSQ compound having a degree of condensation of substantially 100% be produced by the method of the first embodiment, all side chains are preferably selected from the aforementioned organic groups containing an aliphatic branched, cyclic or polycyclic skeleton or organic groups containing an aromatic skeleton having a substituent group other than hydrogen and halogen atoms at a vicinal site to the silicon-bonding site.

Resist compositions will be described later. Evaluating a positive thin-film resist composition for micropatterning using only the SSQ mixture as the base polymer, the inventors found that a composition containing more than 40% of an octet condensate having a degree of condensation of substantially 100% can improve the capability of resolving repetitive micropatterns, so called line-and-space patterns, as compared with a composition containing less than or equal to 30% of an octet condensate having a degree of condensation of substantially 100% like the SSQ mixture having a high degree of condensation (Si—NMR analysis of the mixture reveals a T3 peak area of 92% and a T2 peak area of 8%) obtained in Example of U.S. Ser. No. 11/393,911; and a more predominant effect is exerted when the composition contains more than 50% of the octet condensate. It is presumed by investigations from various standpoints that this effect is accounted for by not only Tg, but also the increased proportion of 100% SSQ compound.

Resist Composition

The SSQ condensate (or SSQ compound) mixture of the invention may be used as the base resin in a resist composition directly in condensate mixture form or after isolation, and particularly useful as the base resin in a positive resist composition. Then, the fourth embodiment of the invention is a positive resist composition comprising a SSQ compound mixture having a high proportion of SSQ condensate. As described above, none of the prior art succeeded in providing a material comprising at least 30% by weight of a SSQ compound having a degree of condensation of 100% and further having a high Tg due to incorporation of bulky substituent groups. The material of the invention is expected useful not only as a bilayer resist material, but also as an etching mask over a silicon oxide film when side chains having polycyclic structure are incorporated. Then the resulting resist composition is useful as a material for forming a finer feature size pattern via a thin film resist.

Base Resin

In general, the resin serving as the main component in chemically amplified positive resist compositions is required to have a functional group giving a function of switching from insolubility to solubility in alkaline water under the action of an acid catalyst (typically, an acidic functional group protected with an acid labile group), a polar group giving a function of imparting adhesion to substrate or the like or restraining swell upon solubility switching, or a functional group having resistance to plasma etching using halogen or the like, though not necessarily required for silicon-containing resist compositions. In some cases, all the functions are met by a single functional group. Alternatively, for a resin lacking any of the above functions or a resin having a weak function, a number of methods have been reported including a method of satisfying the functions as a whole by combining different resins, a method of satisfying the functions as a whole by adding a functional non-polymeric substance.

A SSQ condensate mixture such as one having a degree of condensation of substantially 100%, which is suitable as the resist composition of the invention, has at least one of the above-mentioned functional groups. Using such a mixture having all the functions or a mixture obtained by mixing such mixtures so as to have all the functions, alone in combination with a photoacid generator, a resist composition can generally be formulated.

In the event a SSQ condensate has a side chain possessing a function of dissolving in alkaline developer, but lacking a function of changing alkali solubility under the action of an acid catalyst, that is, a solubility switching function, or possessing only a weak solubility switching function, a polymeric compound (any of resins used in conventional resist compositions may be employed as a general rule) or non-polymeric compound having a solubility switching function, commonly known as "dissolution inhibitor," may be added in formulating a resist composition.

Also when a pattern is formed from a resist film having a relatively large thickness, a composition having low molecular weight compounds combined would give a pattern with less rectangularity, that is, with rounded shoulders. In this case, a pattern profile may be improved by adding a polymer having a weight average molecular weight of at least 4,000. The resin used for this purpose is selected from resins which are soluble in alkaline developer or resins having a solubility switching function as used in conventional resist compositions.

When the SSQ condensate mixture is mixed with another polymer to formulate a resist composition, the polymer is selected from resins having a functional group for adding a certain function, or resins which themselves can be used as the resist resin. Applicable are those resins having a basic skeleton which is a polyhydroxystyrene skeleton, poly(meth) acrylic acid skeleton, ROMP skeleton, polynorbornene skeleton, COMA skeleton or skeleton comprising a combination of such skeletons. However, a resin having a high silicon content is preferred when resistance to oxygen plasma etching is desired. In this case, a choice may be made among those resins having a silicon-containing side chain on any of the foregoing skeletons, polysilsesquioxanes, polysiloxanes, and polymers having a combination of such skeletons. A number of exemplary such polymers are known in the art, for example, from JP-A 2004-354417 and Japanese Patent Application No. 2005-38701 of the present inventors. However, if the functional side chain the SSQ condensate of the invention possesses and the functional side chain the foregoing polymers possess are different in nature, especially largely different in overall polarity, an intimate mixing within the resist film cannot be achieved in some cases. To achieve satisfactory mixing between them, an effective design for enhancing compatibility is made such that both components possess polar groups, typically carboxyl groups, lactone skeletons, phenolic hydroxyl groups, or aliphatic hydroxyl groups having fluorine substituted at a neighboring site.

Where the target pattern rule is equal to or less than 100 nm and the resist film is relatively thin, the necessity that the material of which the resist composition is made be a polymer is alleviated. Particularly when a pattern with a feature size equal to or less than 70 nm is formed, a higher resolution may be achieved by reducing the addition ratio of the polymer or even omitting the addition of polymer. In these resist compositions, a polymer having a relatively low, uniform molecular weight is believed advantageous for micropatterning because it exhibits a definite and sharp dissolution behavior. The 100% condensed SSQ compound mixture of the invention, despite some molecular weight variants due to different type of substituent group, is of great interest as a typical model because molecules having a similar number of units become the main component of the resist composition.

In the resist composition comprising as the base resin the 100% condensed SSQ compound mixture of the invention, better results are obtained when the side chain having a solubility switching function relative to alkaline water (typically the side chain having an acidic functional group protected with an acid labile group) is at least 10 mol % of the entire side chains, and a higher contrast is expected when the same is at least 20 mol %. A functional group imparting adhesion is also essential and preferably at least 5 mol %, especially 20 to 80 mol %.

As described above, the use of a base polymer of molecules with a somewhat uniform size is believed advantageous for miniaturization. In fact, a mixture containing more than 40 mol % (on silicon basis) of octet as produced by the inventive method was found to have improved maximum resolution in forming a line-and-space pattern, with a mixture containing more than 50 mol % of octet being more effective.

Photoacid Generator

In the resist composition of the invention, a photoacid generator is essential as well as the aforementioned base resin. The acid generator in resist compositions is a compound which, after formation of a resist film, generates an acid upon receipt of the energy of irradiating light during pattern exposure. In the resist film formed from the inventive resist composition, the acid thus generated functions as a catalyst and acts on the acid labile protective groups on the protected acidic substituent groups in the SSQ condensate and/or dissolution inhibitor or additive resin, causing scission of the protective groups and rendering the acidic substituent groups free. As a result, a region of the resist film where the deprotection reaction occurs is turned to be soluble in aqueous alkaline developer. With respect to the acid generator, a number of techniques relating to non-silicone resist compositions have already been disclosed, for example, in JP-A 2004-149754. All these techniques are applicable to the present invention. Among others, preferred photoacid generators include sulfonium salts, iodonium salts, sulfonyldiazomethanes, N-sulfonyloxyimides, and N-sulfonyloxyoximes. These photoacid generators are illustrated below while they may be used alone or in admixture of two or more in a common system or in different systems. Inter alia, onium salts, especially sulfonium salts are useful acid generators. They may also advantageously be used as a co-acid generator along with another acid generator.

Sulfonium salts are salts of sulfonium cations with sulfonates. Exemplary sulfonium cations include substituted or unsubstituted triphenylsolfoniums such as triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium; substituted or unsubstituted allylsulfoniums such as 2-naphthyldiphenylsulfonium and dimethyl-2-naphthylsulfonium; and sulfoniums having a non-aromatic substituent group such as 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium.

Exemplary sulfonates include sulfonates in which the carbon neighboring a sulfonyl group is fluorine substituted, such as trifluoromethanesulfonate, nonafluorobutanesulfonate, heptadecafluorooctanesulfonate, 2,2,2-trifluoroethanesulfonate, perfluoro-4-ethylcyclohexanesulfonate and pentafluorobenzenesulfonate; aromatic sulfonates such as 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, and naphthalenesulfonate; and alkylsulfonates such as camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Included are combinations of aryliodonium cations including diphenyliodinium, bis(4-tert-butylphenyl)iodonium, 4-tert-butoxyphenylphenyliodonium, and 4-methoxyphenylphenyliodonium with sulfonates as exemplified above.

Suitable sulfonyldiazomethane compounds include alkyl-substituted sulfonyldiazomethanes such as bis(1,1-dimethylethylsulfonyl)diazomethane, bis(cyclohexylsulfonyl)diazomethane; fluoroalkyl-substituted sulfonyldiazomethanes such as bis(perfluoroisopropylsulfonyl)diazomethane; and aryl-substituted sulfonyldiazomethanes such as bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, tert-butoxycarbonyl-4-methylphenylsulfonyldiazomethane.

N-sulfonyloxyimide photoacid generators include combinations of imide skeletons such as succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide with sulfonates as exemplified above, wherein dehydrating condensation of sulfonates to imide skeletons forms sulfonic acid imides.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Oxime sulfonate photoacid generators include glyoxime derivatives as described in Japanese Patent No. 2,906,999 and JP-A 9-301948, such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, those in which the sulfonate moiety is replaced by a skeleton exemplified as the sulfonate of the onium salt, and those in which the substituent group on the glyoxime skeleton is another alkyl group.

Also included are the oxime sulfonates described in U.S. Pat. No. 6,004,724, for example, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example, 2,2,2-trifluoro-1-phenyl-ethanone oxime-O-methylsulfonate, 2,2,2-trifluoro-1-phenyl-ethanone oxime-O-(10-camphorylsulfonate), and 2,2,2-trifluoro-1-phenyl-ethanone oxime-O-(4-methoxyphenyl-sulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, and α-(4-nitrobenzenesulfonyloxyimino)-phenylacetonitrile.

Suitable bisoxime sulfonates include those described in JP-A 9-208554, for example, bis(α-(4-toluenesulfonyloxy)imino)-p-phenylenediacetonitrile and bis(α-(benzenesulfonyloxy)imino)-p-phenylenediacetonitrile.

Also, the oxime sulfonates described in International Publication 2004/074242 are good acid generators providing a high sensitivity. Examples include CGI-1906, CGI-1311, CGI-1325, CGI-1380, CGI-1397, CGI-261, CGI-263 and CGI-268, commercially available from Ciba Speciality Chemicals.

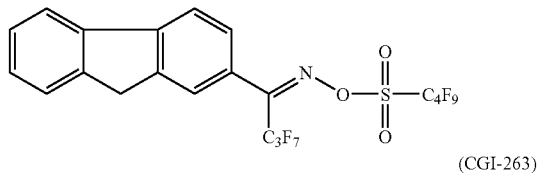
(CGI-1906)

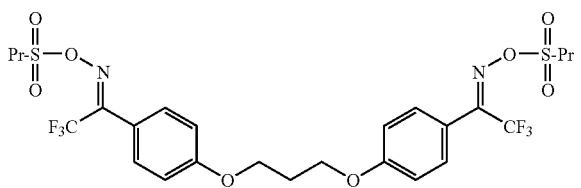
(CGI-263)

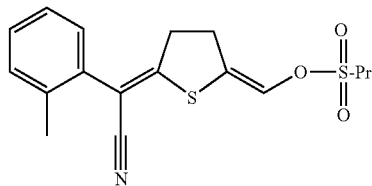
(CGI-1397)

Note that Pr is propyl.

Of the foregoing photoacid generators, sulfonium salts are preferred. As to the cation side, triphenylsulfonium, 4-methylphenyldiphenylsulfonium, 4-tert-butoxyphenyldiphenylsulfonium, 4-tert-butylphenyldiphenylsulfonium, tris(4-tert-butylphenyl)sulfonium, 4-alkoxynaphthyltetrahydrothiophenium, phenacyldiphenylsulfonium, and phenacyltetrahydrothiophenium are useful cations having a high sensitivity and acceptable stability. As to the anion side, perfluorobutanesulfonate, perfluorooctanesulfonate, perfluoro-4-ethylcyclohexanesulfonate and those sulfonates in which the carbon neighboring a sulfonyl group is fluorinated are preferred for higher resolution. An oxime sulfonate acid generator CGI-1906 by Ciba Speciality Chemicals is one preferred acid generator capable of providing a high sensitivity and high resolution.

In the resist composition of the invention, the photoacid generator is added in an effective amount, typically 0.3 to 10 parts, and preferably 0.5 to 5 parts by weight, per 100 parts by weight of the entire base resin, though not limited thereto. Excessive amounts of the photoacid generator may degrade resolution and give rise to a problem of foreign matter during development and resist peeling. The photoacid generators may be used alone or in admixture. It is also possible to use a photoacid generator having a low transmittance at the exposure wavelength in a controlled amount so as to adjust the transmittance of a resist film.

Nitrogen-Containing Compound (Basic Compound)

In the resist composition of the invention, one or more organic nitrogen-containing compound is compounded. The organic nitrogen-containing compound used herein is preferably a compound capable of suppressing the rate of diffusion when the acid generated by the photoacid generator diffuses within the resist film. The inclusion of this nitrogen-containing compound is effective for improving the resolution, suppressing changes in sensitivity following exposure, and reducing substrate and environment dependence, as well as improving the exposure latitude and the pattern profile. Examples of organic nitrogen-containing compounds or basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives. As regards the basic compounds, a number of examples are described in our preceding patent applications, and they are applicable to the composition of the invention.

The organic nitrogen-containing compound is preferably formulated in an amount of 0.001 to 2 parts, and especially 0.01 to 1 part by weight, per 100 parts by weight of the entire base resin. Less than 0.001 part of the nitrogen-containing compound achieves no or little addition effect whereas more than 2 parts would result in too low a sensitivity.

Organic Solvent

An organic solvent is used in the resist composition of the invention. It may be any organic solvent in which the base resin, acid generator, and other components are soluble. Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the acid generator is most soluble therein.

An appropriate amount of the organic solvent used is about 200 to 1,000 parts, especially about 400 to 800 parts by weight per 100 parts by weight of the solids in the resist composition.

Other Components

In the resist composition of the invention, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996). Examples of the acid-amplifier compound include tert-butyl 2-methyl-2-tosyloxymethylacetoacetate and 2-phenyl-2-(2-tosyloxyethyl)-1,3-dioxolane, but are not limited thereto. Of well-known photoacid generators, many of those compounds having poor stability, especially poor thermal stability exhibit an acid-amplifier compound-like behavior. In the resist composition of the invention, an appropriate amount of the acid-amplifier compound is up to 2 parts, and especially up to 1 part by weight per 100 parts by weight of the entire base resin. Excessive amounts of the acid-amplifier compound makes diffusion control difficult, leading to degradation of resolution and pattern profile.

The resist composition of the invention may additionally include an acetylene alcohol derivative for the purpose of enhancing the shelf stability. Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

All these are polyalkylene oxide alcohol derivatives having an acetylene skeleton within the molecule. The acetylene alcohol derivative is preferably added in an amount of 0.01 to 2% by weight, and more preferably 0.02 to 1% by weight of the resist composition. Less than 0.01% by weight would be ineffective for improving coating characteristics and shelf stability, whereas more than 2% by weight would result in a resist having a low resolution.

In the resist composition of the invention, there may be further included optional components such as surfactants for improving coating characteristics. Such optional components are added in any desired amounts insofar as the benefits of the invention are not impaired.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M Co., Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dainippon Ink & Chemicals, Inc., and X-70-092 and X-70-093 from Shin-Etsu Chemical Co., Ltd. Preferred surfactants are Fluorad FC-430 from Sumitomo 3M Co., Ltd., KH-20, KH-30 from Asahi Glass Co., Ltd., and X-70-093 from Shin-Etsu Chemical Co., Ltd.

Patterning

Pattern formation using the resist composition of the invention may be carried out by a known lithographic technique. For example, the resist composition is applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern is then placed over the resist film, and the film exposed through the mask to an electron beam or to high-energy radiation of up to 300 nm wavelength such as deep-UV, an excimer laser, or x-ray in a dose of about 1 to 200 mJ/cm$^2$, and preferably about 10 to 100 mJ/cm$^2$. The resist film is then post-exposure baked (PEB) on a hot plate at 60 to 150° C. for 10 seconds to 5 minutes, and preferably at 80 to 130° C. for 30 seconds to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dip, puddle, or spray method for a period of 5 seconds to 3 minutes, and preferably 15 seconds to 2 minutes. These steps result in the formation of the desired pattern on the substrate. Of the various types of high-energy radiation that may be used, the resist composition of the invention is best suited to fine pattern formation with, in particular, deep-UV having a wavelength of 254 to 120 nm, excimer lasers, specifically KrF laser (248 nm), ArF laser (193 nm), Kr$_2$ laser (146 nm), and KrAr laser (134 nm), lasers, specifically F$_2$ laser (157 nm) and Ar$_2$ laser (126 nm), x-ray, and electron beam. The invention is applicable to not only dry light exposure, but also light exposure by the immersion process.

By virtue of the synthesis method of SSQ condensate having a degree of condensation of 100% as the predominant component, the resist composition of the invention can use substituent groups having a high carbon ratio on the side chain as compared with silicon-containing resist compositions of the ordinary design. Then the resist composition of the invention can be used not only as the single-layer resist, but also advantageously as the upper layer in the bilayer resist process.

Described below is a method of processing a substrate using the resist composition according to the bilayer resist process. A substrate to be processed is usually an inorganic substrate. An underlying film to be described later is formed on the substrate. The resist composition of the invention is applied onto the underlying film to form a resist coating. If necessary, an antireflective coating may be formed between the resist coating and the underlying film. The resist coating is patterned by the above-mentioned procedure, after which the pattern is transferred to the underlying film by oxygen gas etching using the resist pattern as an etching mask. The oxygen gas etching is reactive plasma etching using oxygen gas as a main component. With this method, silicon oxide having high resistance to oxygen gas etching is formed from the resist pattern, allowing the underlying organic film to be processed at a high aspect ratio. $SO_2$, $CO_2$, CO, $NH_3$, or $N_2$ gas may be added to the oxygen gas for protecting side walls for preventing the film from being configured to a T-top profile by over-etching. Prior to the oxygen gas etching, brief etching with a fluorocarbon gas may be carried out for removing any scum of the resist after development and smoothening line edges to prohibit roughening.

Subsequently, the patternable film is subjected to dry etching. Etching with a fluorocarbon gas as a main component is carried out when the patternable film is $SiO_2$ or $Si_3N_4$. Exemplary fluorocarbon gases are $CF_4$, $CHF_3$, $CH_2F_2$, $C_2F_6$, $C_3F_8$, $C_4F_{10}$ and $C_5F_{12}$. At the same time as the dry etching of the patternable film, the silicon-containing resist film can be stripped off. Etching with chlorine or bromine gas as a main component is employed when the patternable film is polysilicon, tungsten silicide, TiN/Al or the like.

In the bilayer resist process, the underlying film may be made of any organic material which is selected from a number of well-known organic film materials. As the organic film, aromatic resins are generally preferred, with those aromatic resins which can be crosslinked during film formation so as to prevent intermixing during coating and film formation of the resist composition thereon being especially preferred.

Suitable aromatic resins include novolac resins and polyhydroxystyrene resins. Aromatic resins further having a fluorene or indene skeleton are advantageously used to enhance the etching resistance of the organic film during etching of the substrate after the pattern has been transferred to the organic film. It is possible to form an antireflective coating on the organic film and to form a resist film of the invention thereon. If the organic film possesses an antireflective function, advantageously the overall process becomes simpler. To impart an antireflective function, an aromatic resin having an anthracene or naphthalene skeleton or a benzene skeleton with a conjugated unsaturated bond is preferably used.

Crosslinks can be formed by a crosslinking method as employed for thermosetting resins and negative resist compositions. In general, a composition solution comprising a resin having functional groups such as phenol, alkoxyphenyl, alcohol or carboxylic acid, a material capable of thermal decomposition to generate an acid, and a crosslinker capable of forming crosslinks with the functional groups in the presence of an acid catalyst, such as hexaalkoxymethylmelamine is applied onto a patternable substrate, and the coating is heated to generate an acid, with which crosslinks are formed.

EXAMPLE

Preparation Examples and Examples are Given Below together with Comparative Examples for further illustrating the invention although the invention is not limited thereby. All parts are by weight. The abbreviations used herein are Et for ethyl, GPC for gel permeation chromatography, NMR for nuclear magnetic resonance, and Mw for weight average molecular weight. Trifunctional silicon units T1 to T3 are defined as follows, depending on the number of siloxane bonds.

T1: units with one siloxane bond formed (the remaining two are silanol groups or residual hydrolyzable groups), T2: units with two siloxane bonds formed (the remaining one is a silanol group or residual hydrolyzable group), and T3: units with three siloxane bonds formed (completely condensed units).

The T1/T2/T3 ratio designates a molar ratio of the respective units, determined by Si—NMR.

Silane Monomers 1 to 8 used herein have the structural formulae shown below.

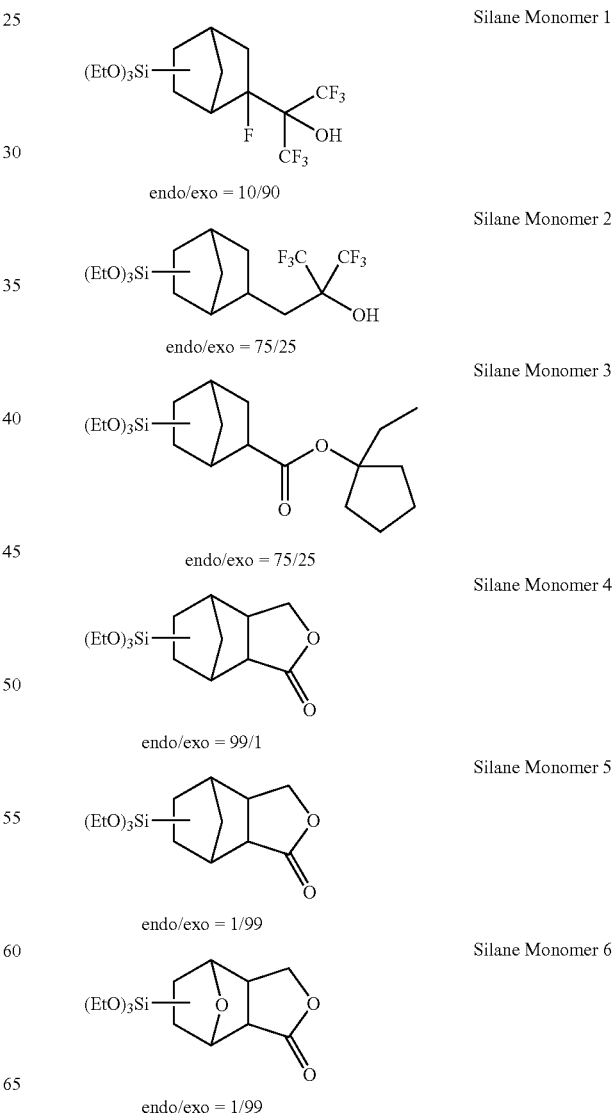

-continued

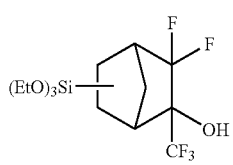

Silane Monomer 7 endo/exo = 80/20

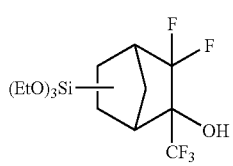

Silane Monomer 8 endo/exo = 20/80

Example 1

Synthesis of Polymer 1

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 44.2 g (100 mmol) of Silane Monomer 1 in 40 g of acetonitrile was added dropwise over 5 hours. The solution was kept at 30° C. for 40 hours for maturation. The reaction solution was diluted with methyl isobutyl ketone (MIK) and washed repeatedly with deionized water until the organic layer became neutral. The subsequent concentration yielded 37.9 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 33.7 g of a polymer.

On NMR and GPC analyses, the condensate was found to have a Mw of 2,550 and a condensation ratio (T1/T2/T3) of 0/3/97 as a whole and contain 90% (calculated as area ratio by GPC, the same hereinafter) of cage-shaped octet having a degree of condensation of 100%.

Comparative Example 1

Synthesis of Polymer 2

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 43.8 g (100 mmol) of Silane Monomer 2 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 38.1 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 33.8 g of a polymer.

On NMR and GPC analyses, the condensate was found to have a Mw of 2,590 and a condensation ratio (T1/T2/T3) of 0/8/92 as a whole and contain 75% of cage-shaped octet having a degree of condensation of 100%.

Example 2

Synthesis of Polymer 3

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 8.8 g (20 mmol) of Silane Monomer 2, 12.0 g (30 mmol) of Silane Monomer 3, and 15.7 g (50 mmol) of Silane Monomer 5 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 28.5 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 25.5 g of a polymer.

On NMR and GPC analyses, the condensate was found to have a Mw of 1,760 and a condensation ratio (T1/T2/T3) of 0/2/98 as a whole and contain 80% of cage-shaped octet having a degree of condensation of 100%.

Example 3

Synthesis of Polymer 4

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 8.8 g (20 mmol) of Silane Monomer 2, 12.0 g (30 mmol) of Silane Monomer 3, and 15.7 g (50 mmol) of Silane Monomer 5 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 28.5 g of an oligomer.

Using 100 g of MIK, the oligomer was transferred into a three-necked 300-ml flask equipped with a stirrer, reflux condenser, and thermometer. 2.87 g of 40% tetramethylammonium hydroxide was added to the solution, which was heated under reflux for 24 hours while removing water through an ester adaptor. The reaction solution was cooled down, diluted with MIK, and washed repeatedly with deionized water until the organic layer became neutral. The subsequent concentration yielded 26.0 g of a polymer.

On NMR and GPC analyses, the condensate was found to have a Mw of 2,250 and a condensation ratio (T1/T2/T3) of 0/3/97 as a whole and contain 65% of cage-shaped octet having a degree of condensation of 100%.

Example 4

Synthesis of Polymer 5

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 8.8 g (20 mmol) of Silane Monomer 2, 12.0 g (30 mmol) of Silane Monomer 3, and 15.8 g (50 mmol) of Silane Monomer 6 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 28.0 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 24.9 g of a polymer.

On NMR and GPC analyses, the condensate was found to have a Mw of 1,780 and a condensation ratio (T1/T2/T3) of 0/1/99 as a whole and contain 80% of cage-shaped octet having a degree of condensation of 100%.

Example 5

Synthesis of Polymer 6

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 8.8 g (20 mmol) of Silane Monomer 1, 12.0 g (30 mmol) of Silane Monomer 3, and 15.7 g (50 mmol) of Silane Monomer 5 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 28.9 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 25.4 g of a polymer.

On NMR and GPC analyses, the condensate was found to have a Mw of 1,850 and a condensation ratio (T1/T2/T3) of 0/1/99 as a whole and contain 85% of cage-shaped octet having a degree of condensation of 100%.

Comparative Example 2

Synthesis of Polymer 7

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 8.8 g (20 mmol) of Silane Monomer 2, 12.0 g (30 mmol) of Silane Monomer 3, and 15.7 g (50 mmol) of Silane Monomer 4 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 28.6 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 25.8 g of a polymer.

On NMR and GPC analyses, the condensate was found to have a Mw of 2,030 and a condensation ratio (T1/T2/T3) of 0/12/88 as a whole and contain 55% of cage-shaped octet having a degree of condensation of 100%.

Comparative Example 3

Synthesis of Polymer 8

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 8.8 g (20 mmol) of Silane Monomer 2, 12.0 g (30 mmol) of Silane Monomer 3, and 15.7 g (50 mmol) of Silane Monomer 4 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 28.6 g of an oligomer.

Using 100 g of MIK, the oligomer was transferred into a three-necked 300-ml flask equipped with a stirrer, reflux condenser, and thermometer. 2.87 g of 40% tetramethylammonium hydroxide was added to the solution, which was heated under reflux for 24 hours while removing water through an ester adaptor. The reaction solution was cooled down, diluted with MIK, and washed repeatedly with deionized water until the organic layer became neutral. The subsequent concentration yielded 26.1 g of a polymer.

On NMR and GPC analyses, the condensate was found to have a Mw of 2,230 and a condensation ratio (T1/T2/T3) of 0/16/84 as a whole and contain 45% of cage-shaped octet having a degree of condensation of 100%.

Example 6

Synthesis of Polymer 9

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 7.6 g (20 mmol) of Silane Monomer 8, 12.0 g (30 mmol) of Silane Monomer 3, and 15.7 g (50 mmol) of Silane Monomer 5 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 27.9 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 24.3 g of a polymer.

On NMR and GPC analyses, the condensate was found to have a Mw of 1,630 and a condensation ratio (T1/T2/T3) of 0/11/89 as a whole and contain 75% of cage-shaped octet having a degree of condensation of 100%.

Comparative Example 4

Synthesis of Polymer 10

A four-necked 300-ml flask equipped with a stirrer, reflux condenser, dropping funnel and thermometer was charged with 10 g of 2.37% oxalic acid solution and 40 g of acetonitrile and maintained at 30° C. To the flask, 7.6 g (20 mmol) of Silane Monomer 7, 12.0 g (30 mmol) of Silane Monomer 3, and 15.7 g (50 mmol) of Silane Monomer 5 in 40 g of acetonitrile was added dropwise over 5 hours. The solution was kept at 30° C. for 40 hours for maturation. The reaction solution was diluted with MIK and washed repeatedly with deionized water until the organic layer became neutral. The subsequent concentration yielded 27.9 g of an oligomer.

Using 100 g of MIK, the oligomer was transferred into a three-necked 300-ml flask equipped with a stirrer, reflux condenser, and thermometer. 1.68 g of potassium hydroxide was added to the solution, which was heated under reflux for 20 hours. The reaction solution was cooled down, diluted with MIK, and washed repeatedly with deionized water until the organic layer became neutral. The subsequent concentration yielded 24.4 g of a polymer.

On NMR and GPC analyses, the condensate was found to have a Mw of 1,800 and a condensation ratio (T1/T2/T3) of 0/14/86 as a whole and contain 55% of cage-shaped octet having a degree of condensation of 100%.

Example 7

A coating solution for forming positive resist film was prepared by dissolving 100 parts of Polymer 3 synthesized in Example 2 as a base polymer, 2 parts of a photoacid generator (triphenylsulfonium nonafluoro-n-butanesulfonate) and 0.1 part of tributylamine in 900 parts of a solvent (propylene glycol monomethyl ether acetate, PGMEA) and filtering through a filter with a pore size of 0.2 μm. Using a spin coater, the resist solution was applied to a silicon wafer having a 78-nm antireflective coating of ARC29A (Nissan Chemical Industries, Ltd.) formed thereon, and baked at 120° C. for 60 seconds to form a resist film of 160 nm thick. The resist film was exposed using an ArF excimer laser stepper NSR-S307E (Nikon Corporation; NA 0.85, σ 0.93), then baked (PEB) at 100° C. for 60 seconds, and developed for 30 seconds with a 2.38 wt % aqueous solution of tetramethylammonium hydroxide (TMAH), thereby giving a positive pattern. The resist had a maximum resolution of 65 nm. It is noted that of the thus formed resist patterns, the minimum feature size of a pattern which is removed to the bottom and still maintains a desired profile is the maximum resolution.

Example 8

A coating solution for forming positive resist film was prepared by dissolving 100 parts of Polymer 4 synthesized in Example 3 as a base polymer, 2 parts of a photoacid generator (triphenylsulfonium nonafluoro-n-butanesulfonate) and 0.1 part of tributylamine in 900 parts of a solvent (PGMEA) and filtering through a filter with a pore size of 0.2 μm. Using a spin coater, the resist solution was applied to a silicon wafer having a 78-nm antireflective coating of ARC29A (Nissan Chemical Industries, Ltd.) formed thereon, and baked at 120° C. for 60 seconds to form a resist film of 160 nm thick. The resist film was exposed using an ArF excimer laser stepper NSR-S307E (Nikon Corporation; NA 0.85, σ 0.93), then baked (PEB) at 100° C. for 60 seconds, and developed for 30 seconds with a 2.38 wt % TMAH solution, thereby giving a positive pattern. The resist had a maximum resolution of 70 nm.

Comparative Example 5

A coating solution for forming positive resist film was prepared by dissolving 100 parts of Polymer 7 synthesized in Comparative Example 2 as a base polymer, 2 parts of a photoacid generator (triphenylsulfonium nonafluoro-n-butanesulfonate) and 0.1 part of tributylamine in 900 parts of a solvent (PGMEA) and filtering through a filter with a pore size of 0.2 μm. Using a spin coater, the resist solution was applied to a silicon wafer having a 78-nm antireflective coating of ARC29A (Nissan Chemical Industries, Ltd.) formed thereon, and baked at 120° C. for 60 seconds to form a resist film of 160 nm thick. The resist film was exposed using an ArF excimer laser stepper NSR-S307E (Nikon Corporation; NA 0.85, σ 0.93), then baked (PEB) at 100° C. for 60 seconds, and developed for 30 seconds with a 2.38 wt % TMAH solution, thereby giving a positive pattern. The resist had a maximum resolution of 80 nm.

Comparative Example 6

A coating solution for forming positive resist film was prepared by dissolving 100 parts of Polymer 8 synthesized in Comparative Example 3 as a base polymer, 2 parts of a photoacid generator (triphenylsulfonium nonafluoro-n-butanesulfonate) and 0.1 part of tributylamine in 900 parts of a solvent (PGMEA) and filtering through a filter with a pore size of 0.2 μm. Using a spin coater, the resist solution was applied to a silicon wafer having a 78-nm antireflective coating of ARC29A (Nissan Chemical Industries, Ltd.) formed thereon, and baked at 120° C. for 60 seconds to form a resist film of 160 no thick. The resist film was exposed using an ArF excimer laser stepper NSR-S307E (Nikon Corporation; NA 0.85, σ 0.93), then baked (PEB) at 100° C. for 60 seconds, and developed for 30 seconds with a 2.38 wt % TMAH solution, thereby giving a positive pattern. The resist had a maximum resolution of 85 nm.

It is evident from Examples 7 and 8 and Comparative Examples 5 and 6 that an improvement in resolution is made by increasing the proportion of cage-shaped octet having a degree of condensation of 100%.

Japanese Patent Application No. 2006-264623 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a mixture of silsesquioxane compounds comprising silsesquioxane units having a side chain including a direct bond between a silicon atom and a norbornane skeleton in which some methylene groups may be replaced by oxygen atoms and having a degree of condensation of substantially 100%, wherein a dimethylene chain of the norbornane skeleton remote from the silicon bonded side is substituted with at least one substituent group other than hydrogen, and
an isomer having a bulkier substituent group on said dimethylene chain at an exo position is present in a higher proportion,
said method comprising reacting a silsesquioxane compound bearing hydrogen as substituent groups and having a degree of condensation of substantially 100% with a norbornene derivative in which a dimethylene chain has substituted thereon at least one substituent group other than hydrogen, an isomer having a bulkier substituent group on said dimethylene chain at an exo position is present in a higher proportion, and some methylene groups may be replaced by oxygen atoms.

* * * * *